(12) United States Patent
Tajiri et al.

(10) Patent No.: US 6,924,348 B2
(45) Date of Patent: Aug. 2, 2005

(54) POLYAMIDE ACID AND POLYIMIDE, AND OPTICAL MATERIAL

(75) Inventors: Kozo Tajiri, Suita (JP); Masayoshi Kuwabara, Ibaraki (JP); Yasunori Okumura, Toride (JP); Tohru Matsuura, Tokyo (JP); Noriyoshi Yamada, Tokyo (JP)

(73) Assignees: Nippon Shokubai Co., Ltd., Osaka (JP); NTT Advanced Technology Corporation, Tokyo (JP)

( * ) Notice: Subject to any disclaimer, the term of this patent is extended or adjusted under 35 U.S.C. 154(b) by 27 days.

(21) Appl. No.: 10/194,791

(22) Filed: Jul. 11, 2002

(65) Prior Publication Data

US 2003/0050407 A1 Mar. 13, 2003

(30) Foreign Application Priority Data

Jul. 13, 2001 (JP) ........................................ 2001-213743
Jul. 13, 2001 (JP) ........................................ 2001-213744

(51) Int. Cl.[7] ........................ C08G 73/10; C08G 69/28; G02B 6/10
(52) U.S. Cl. ........................ 528/170; 528/125; 528/126; 528/128; 528/172; 528/173; 528/174; 528/176; 528/179; 528/183; 528/188; 528/220; 528/229; 528/350; 528/352; 528/353; 428/1.1; 428/1.26; 428/1.27; 428/473.5; 385/123; 385/129; 385/141; 385/143
(58) Field of Search ........................ 528/125–128, 528/172–174, 176, 179, 183, 188, 220, 229, 350–353, 170; 428/1.1, 1.26, 473.5; 385/143, 141, 123, 129; 525/420, 432

(56) References Cited

U.S. PATENT DOCUMENTS

| | | | | |
|---|---|---|---|---|
| 3,622,525 | A | * 11/1971 | Miller | .......................... 521/157 |
| 4,196,144 | A | * 4/1980 | Darms | .......................... 564/430 |
| 4,760,126 | A | * 7/1988 | Numata et al. | ............. 528/353 |
| 4,847,359 | A | * 7/1989 | Pfeifer et al. | ................ 528/353 |
| 5,286,841 | A | 2/1994 | Auman et al. | ............... 528/353 |
| 5,598,501 | A | * 1/1997 | Maruo et al. | ............... 385/143 |
| 5,837,804 | A | * 11/1998 | Yamagishi et al. | .......... 528/353 |
| 5,856,431 | A | * 1/1999 | Gibbons et al. | ............. 528/353 |
| 5,929,201 | A | * 7/1999 | Gibbons et al. | ............. 528/353 |
| 6,028,159 | A | * 2/2000 | Suh et al. | .................... 528/170 |
| 6,100,371 | A | * 8/2000 | Suh et al. | .................... 528/353 |
| 6,277,950 | B1 | * 8/2001 | Yang et al. | .................. 528/353 |
| 6,303,743 | B1 | * 10/2001 | You et al. | .................... 528/353 |

FOREIGN PATENT DOCUMENTS

| | | | | |
|---|---|---|---|---|
| EP | 0 438 382 A1 | 7/1991 | | ......... C07D/307/89 |
| EP | 0 480 266 B1 | 6/1996 | | ........... C08G/73/10 |
| EP | 1 275 679 A1 | * 1/2003 | | |
| JP | 200256720 A | 10/1990 | | |
| JP | 5-1148 | 1/1993 | | ........... C08G/73/10 |
| JP | 11-147955 | 2/1999 | | ........... C08G/73/10 |
| JP | 11152335 A | 6/1999 | | |
| JP | 2001213743 | 8/2001 | | |
| JP | 2001213744 | 8/2001 | | |

OTHER PUBLICATIONS

Ando et al., "Perfluorinated Polyimide Synthesis", Macromolecules 25:5858–5860, 1992.

* cited by examiner

Primary Examiner—P. Hampton Hightower
(74) Attorney, Agent, or Firm—Fish & Richardson P.C.

(57) ABSTRACT

A polyimide excelling in heat resistance, chemical resistance, water repellency, dielectric characteristics, electrical characteristics, and optical characteristics and a polyamide acid useful as the raw material therefor are provided. Specifically, a polyamide acid containing a chlorine atom and a fluorine atom and comprising a repeating unit represented by the following formula (1):

(1)

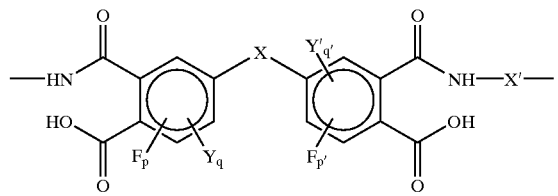

(wherein X and X' independently denote a divalent organic group; Y and Y' independently denote a chlorine, bromine, or iodine atom; p and p' denote independently denote the number of fluorine atom {F in the formula (1)} bonded to the relevant benzene ring, representing an integer of 0–3; q and q' independently denote an integer of 0–3; and p+q total 3, and p'+q' total 3).

14 Claims, 4 Drawing Sheets

POLYAMIDE ACID AND POLYIMIDE, AND OPTICAL MATERIAL

CROSS REFERENCE TO RELATED APPLICATIONS

Pursuant to 35 USC § 119, this application claims the benefit of Japan Patent Application No. 2001-213743 filed Jul. 13, 2001 and Japan Patent Application No. 2001-213744 filed Jul. 13, 2001.

BACKGROUND OF THE INVENTION

1. Field of the Invention

This invention relates to polyimide excelling in heat resistance, chemical resistance, water repellency, dielectric characteristics, electrical characteristics, and optical characteristics, polyamide acid useful as a precursor therefor, and an optical material formed by using the polyimide.

2. Description of the Related Art

The electronics industry as a key industry in the computer and information society is now prospering immensely. The role manifested by polymeric materials in the progress of the electronics technology is truly preeminent. But for the polymeric materials intended for insulation and for fine processing, the electronics age of today would not have been realized. When the polymeric materials which are mainly characterized by their ability to inhibit the flow of electricity are allowed to have their constructions of molecules and aggregates conditioned adequately, they are enabled to manifest such functions as ferroelectricity, high electronic and ionic conductivity, superconductivity, and ferromagnetism as well which have been heretofore held as characteristics of metals, semiconductors, and even inorganic materials. In recent years, therefore, the researches of polymers as electronically functional materials have been greatly expanding their domains. These polymers have been finding utility for various applications such as, for example, layer insulating films and passivation materials for transistors, thyristors, and ICs, junction coating represented by silicone resins, tippy coat grade buffer for relaxing mold stress, .-ray shielding materials for coping with the soft errors in memory elements, die bonding materials, resist materials, semiconductor sealing materials, moisture-proof coating materials for hybrid ICs, TAB (tape automated bonding) grade chip carrier tapes, and multilayer circuit boards.

Among these polymeric materials enumerated above, the polyimide has attracted attention particularly on account of its excellent functions and heat resistance and has incited enthusiastic researches and developments. At present, applications of the polyimide to such usage as mentioned above are attempted actively. JP-A-05-1148, for example, discloses a perfluorinated polyimide that is composed of repeating units exclusively containing a carbon-fluorine bond (C—F bond) instead of a carbon-hydrogen bond (C—H bond). This polyimide indeed possesses sufficient heat resistance for manufacture of a optoelectronic integrated circuit and incurs light transmission loss only very slightly in the wavelength of near-infrared ray, particularly in the wavelength of light communication (1.0–1.7 μm). Notwithstanding this fact, the optical waveguide or the optical fiber core clad which is produced with the aforementioned combination of materials exhibits a refractive index difference, .n, of about 0.2% and fails to offer a sufficiently practicable refractive index difference of not less than 0.5%.

Besides, the polyimide which excels in heat resistance, chemical resistance, water repellency, dielectric characteristics, electrical characteristics, and optical characteristics as mentioned above is strongly demanded and nevertheless has not existed to date. Thus, this invention has been initiated in view of this affairs and is directed toward providing a polyimide excelling in heat resistance, chemical resistance, water repellency, dielectric characteristics, electrical characteristics, and optical characteristics and exhibiting a refractive index difference, .n, exceeding 0.5% relative to the existing perfluorinated polyimide and providing a polyamide acid useful as the raw material for the polyimide.

The other object of this invention is to provide optical materials using the polyimide.

SUMMARY OF THE INVENTION

The present inventors have continued a diligent study with a view to fulfilling the objects mentioned above and have consequently found that a polyimide comprising a carbon-fluorine bond (C—F bond) and/or a carbon-chlorine bond (C—Cl) bond and comprising specific repeating units excels in heat resistance, chemical resistance, water repellency, dielectric characteristics, electrical characteristics, and optical characteristics. They have perfected the present invention based on this knowledge.

This invention provides a polyamide acid that contains a chlorine atom and a fluorine atom and comprises a repeating unit represented by the following formula (1).

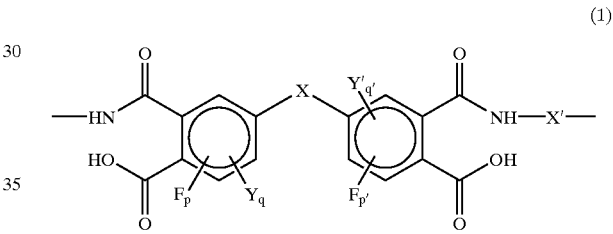

(1)

(wherein X and X' independently denote a divalent organic group; Y and Y' independently denote a chlorine, bromine, or iodine atom; p and p' denote independently denote an integer of 0–3, representing the number of fluorine atom {F in the formula (1)} bonded to the relevant benzene ring; q and q' independently denote an integer of 0–3; and p+q total 3, and p'+q' total 3).

This invention also provides a polyimide that contains a chlorine atom and a fluorine atom and comprises a repeating unit represented by the following formula (2).

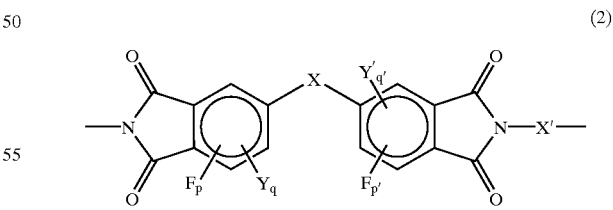

(2)

(wherein X and X' independently denote a divalent organic group; Y and Y' independently denote a chlorine, bromine, or iodine atom; p and p' denote independently denote an integer of 0–3, representing the number of fluorine atom {F in the formula (2)} bonded to the relevant benzene ring; q and q' independently denote an integer of 0–3; and p+q total 3, and p'+q' total 3). This polyimide simultaneously satisfies high light transmittance over the whole transmission wavelength and high heat resistance and excels in chemical resistance, water repellency, dielectric characteristics, electrical characteristics, and optical characteristics and, therefore, is expected to find utility in applications to various optical materials such as printed wiring boards, LSI grade layer insulating films, sealing materials for semiconductor parts, optical parts, optoelectronic integrated circuits (OEIC), and optical waveguides for optoelectronic mixed packaging wiring boards.

The present inventors have also pursued a diligent study with a view to accomplishing the objects mentioned above and have consequently found that a polyimide comprising not exclusively a carbon-fluorine bond (C—F bond) and having part of the bond substituted with a monovalent chemical bond formed of a carbon atom with a halogen atom other than fluorine atom excels in heat resistance, chemical resistance, water repellency, dielectric characteristics, electrical characteristics, and optical characteristics. They have perfected this invention based on this knowledge.

Specifically, this invention provides a polyamide acid possessing a repeating unit represented by the following formula (i).

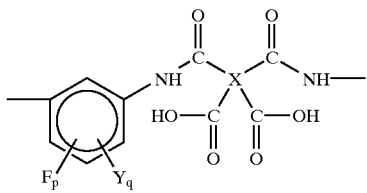

(wherein X denotes a tetravalent organic group; Y denotes a chlorine, bromine, or iodine atom; p denotes an integer of 0–3, representing the number of fluorine atoms {F in formula (i)} bonded to a benzene ring; q denotes an integer of 1–4, and p+q total 4).

The invention also provides a polyimide possessing a repeating unit represented by the following formula (iii).

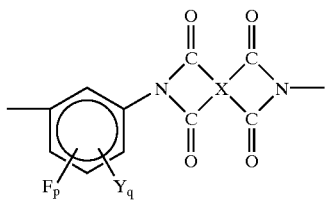

(wherein X denotes a tetravalent organic group; Y denotes a chlorine, bromine, or iodine atom; p denotes an integer of 0–3, representing the number of fluorine atoms {F in formula (iii)} bonded to a benzene ring; q denotes an integer of 1–4, and p+q total 4). This polyimide simultaneously satisfies high light transmittance over the whole transmission wavelength and high heat resistance and excels in chemical resistance, water repellency, dielectric characteristics, electrical characteristics, and optical characteristics and, therefore, is expected to find utility in applications to various optical materials such as printed wiring boards, LSI grade layer insulating films, sealing materials for semiconductor parts, optical parts, optoelectronic integrated circuits (OEIC), and optical waveguides for optoelectronic mixed packaging wiring boards.

DESCRIPTION OF THE PREFERRED EMBODIMENTS

Figure 1:
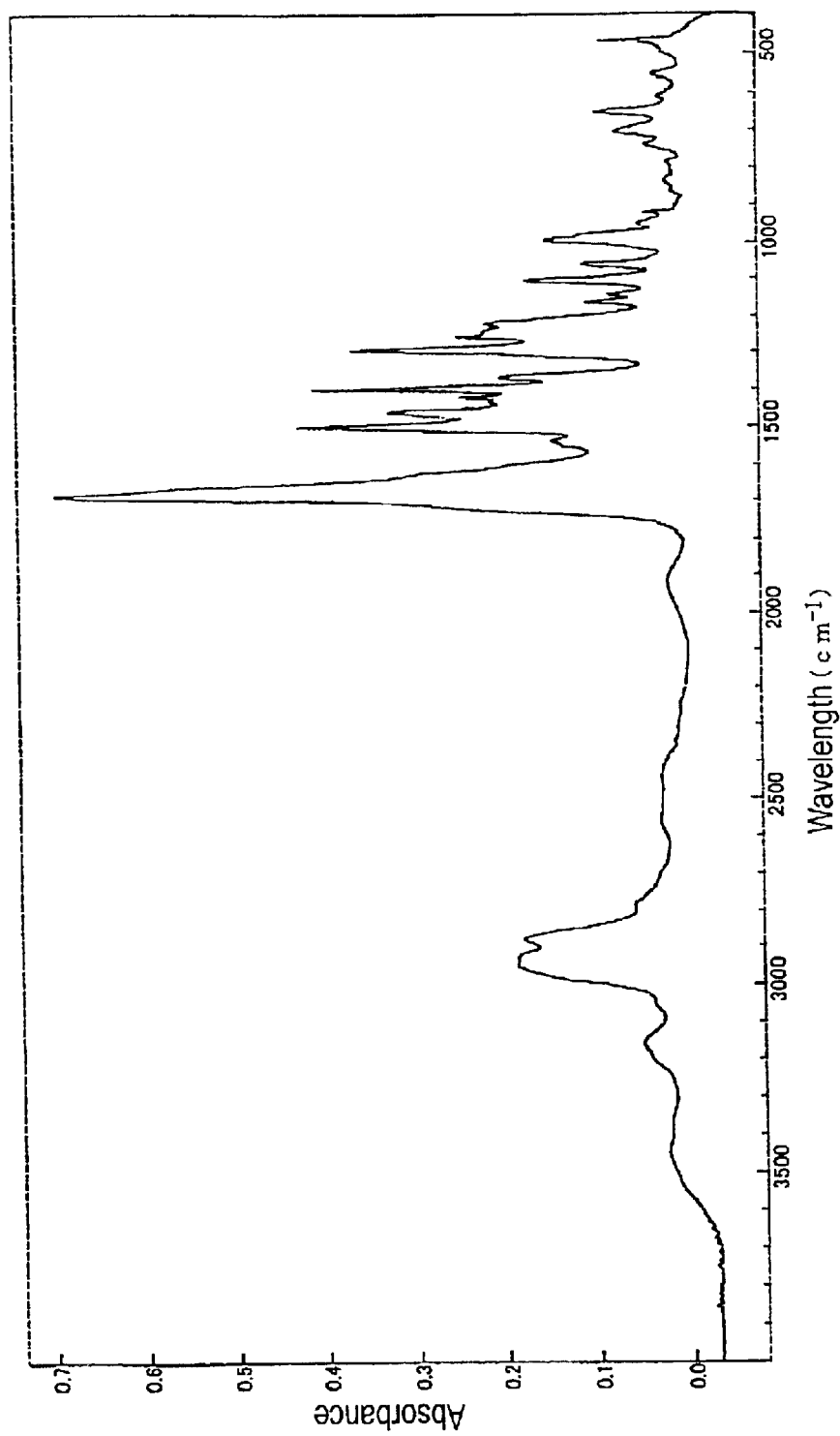
FIG. 1 is an IR spectrum of a polyamide acid obtained in Example 1.

Now, this invention will be described in detail below.

The first aspect of this invention is a polyamide acid containing a chlorine atom and a fluorine atom and comprising a repeating unit represented by the following formula (1).

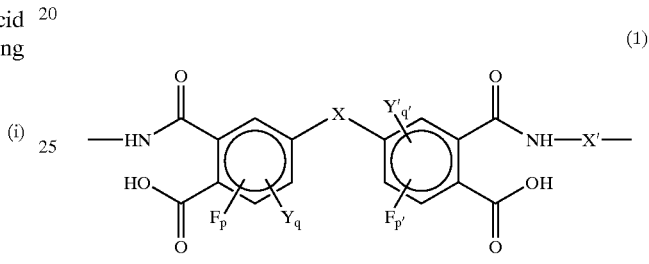

(wherein X and X' independently denote a divalent organic group; Y and Y' independently denote a chlorine, bromine, or iodine atom; p and p' denote independently denote an integer of 0–3, representing the number of fluorine atom {F in the formula (1)} bonded to the relevant benzene ring; q and q' independently denote an integer of 0–3; and p+q total 3, and p'+q' total 3).

Further, the first aspect of the invention is a polyamide acid which is set forth in (1) above and comprises a repeating unit represented by the following formula (3) and/or (3').

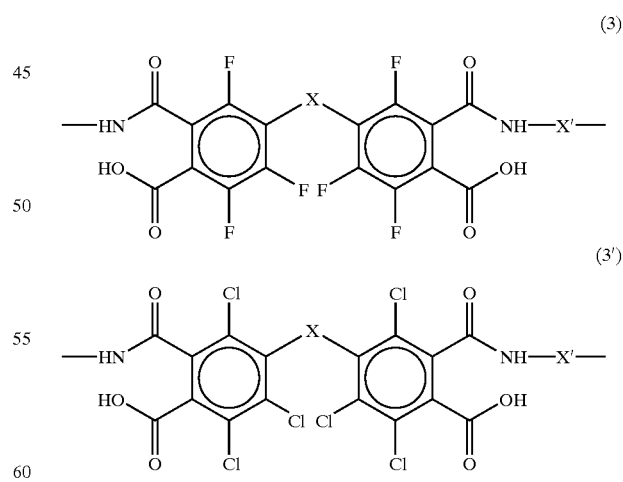

(wherein X and X' independently denote a divalent organic group).

The polyamide acid which comprises a carbon-fluorine bond (C—F bond) and/or a carbon-chlorine bond (C—Cl bond) and also comprises a specific repeating unit as described above is useful as the raw material for the polyimide which excels in heat resistance, chemical resistance, water repellency, dielectric characteristics, electrical characteristics, and optical characteristics.

In the first aspect of the invention, the polyamide acid essentially contains a chlorine atom and a fluorine atom. In this case, the content of chlorine atoms in the polyamide acid does not need to be particularly restricted but may be properly selected in consideration of ease of production and desired characteristics (for example, solubility, heat resistance, chemical resistance, water repellency, dielectric characteristics, electrical characteristics, and optical characteristics). The polyamide acid is preferred to contain chlorine atoms in a quantity of not more than 60% by mass based on the total mass of polyamide acid. If the content of chlorine atoms exceeds 60% by mass, the excess will possibly degrade the solubility of polyamide acid and render production of polyamide acid difficult. Since the polyamide acid of the first aspect of the invention essentially contains a chlorine atom, the content of chlorine atoms in the polyamide acid will not reach 0% by mass. In consideration of the dielectric constant, refractive index, heat resistance, and moisture absorption resistance of the polyimide which is derived from the polyamide acid, the content of chlorine atoms in the polyamide acid is preferably in the range of 4–55% by mass, and particularly preferably in the range of 4–30% by mass, based on the total mass of the polyamide acid.

Further, in the first aspect of the invention, the polyamide acid essentially comprises a repeating unit represented by the aforementioned formula (1). The reason for the polyamide acid comprising the specific repeating unit is that the polyimide to be formed from this polyamide acid accomplishes the desired refractive index (namely, the refractive index difference, .n, relative to the existing perfluorinated polyimide). The polyamide acid of the first aspect of the invention, in the consideration of the light transmission loss in the near-infrared ray, particularly the light communication wavelength (1.0–1.7 μm), prefers the absence of a carbon-hydrogen bond (C—H bond) therefrom.

In the formula (1) mentioned above, X and X' each denote a divalent organic group. In this case, X and X' may be same or different. As concrete examples of the divalent organic group, divalent aliphatic organic groups derived from cycloalkyls, chain alkyls, olefins, and glycols; divalent aromatic organic groups derived from benzene biphenyl, biphenyl ether, bisphenyl benzene, and bisphenoxy benzene; and halogen-containing aliphatic and aromatic organic groups thereof may be cited. Of these divalent organic groups, preferably divalent aromatic organic groups, more preferably divalent halogen-containing aromatic organic groups, and most preferably divalent perhalogenated aromatic organic groups are denoted by "X" and "X'" in the formula (1) mentioned above. The term "perhalogenated aromatic organic group" as used herein means a group having all the carbon-hydrogen bonds (C—H bonds) present therein have been substituted with carbon-halogen bonds {for example, carbon-fluorine bonds (C—F bonds) or carabon-chlorine bonds (C—Cl bonds)}. In consequence of this substitution, the polyimide to be formed from the polyamide acid accomplishes the desired refractive index (namely, the refractive index difference, .n, relative to the existing perfluorinated polyimide) and light communication wavelength (1.0–1.7 μm). As concrete examples of the divalent perhalogenated aromatic organic group, divalent perhalogenated aromatic organic groups derived from benzene biphenyl, biphenyl ether, bisphenyl benzene, and bisphenoxy benzene may be cited.

Examples of the divalent organic groups as "X" in the formula (1) are preferably a direct bond or a divalent group represented by the following formula:

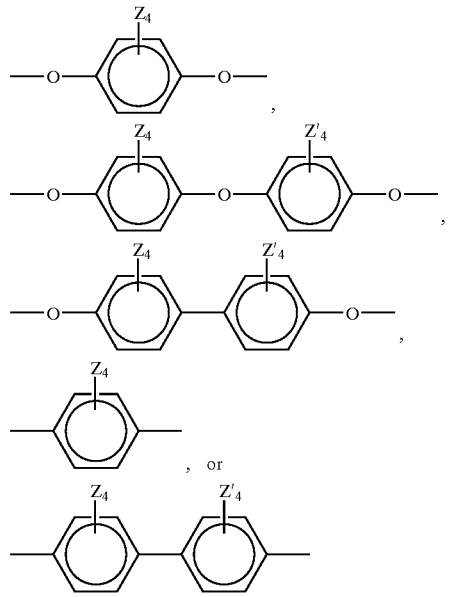

In these divalent groups, more preferably X denotes a direct bond or a divalent group represented by the following formula:

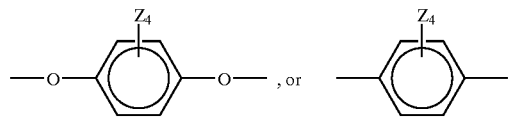

In the formulas enumerated above as representing examples of "X", Z and Z' each denote a halogen atom, namely fluorine, chlorine, bromide, or iodine atom, preferably a fluorine or chlorine atom, and most preferably a chlorine atom. In the formulas enumerated above as representing examples of "X", when Z and Z' are both present, Z and Z' may be same or different. When Z and Z' are present plurally in each benzene ring, they may be same or different in the benzene ring.

Specifically, "X" in the formula (1) mentioned above is preferred to denote a direct bond or a divalent organic group represented by any of the following formulas.

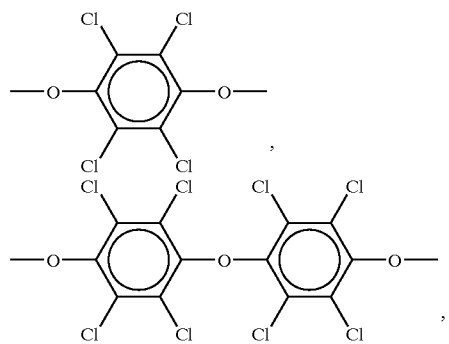

-continued

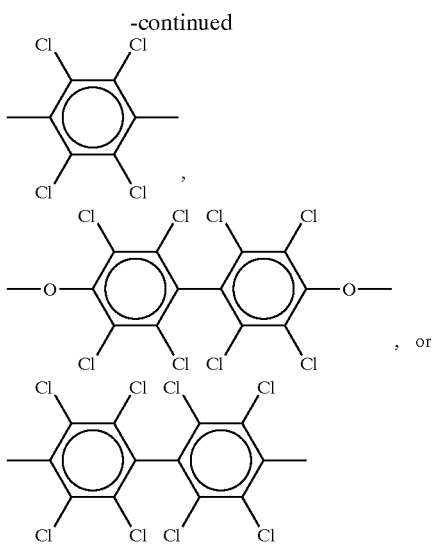
, or

In the examples of "X" enumerated above, the divalent organic group represented by either of the following formulas:

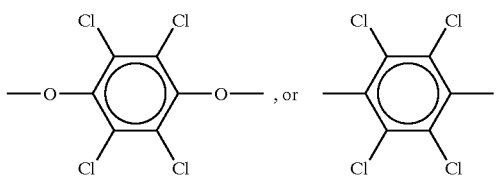
, or particularly the divalent organic group represented by the following formula:

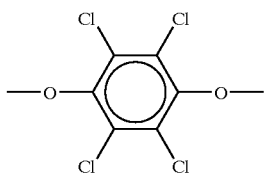

proves advantageous.

As examples of divalent organic groups as "X'" in the formula (1) mentioned above, the groups represented by the following formula:

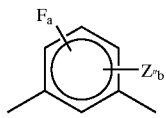

may be cited. In this formula, Z'" denotes a chlorine, bromine, or iodine atom, preferably a chlorine atom or a bromine atom, and most preferably a chlorine atom, a denotes the number of fluorine atoms bonded to a benzene ring, representing an integer of 0–4, preferably 0, 3, or 4, and b denotes the number of "Z'"" bonded to a benzene ring, representing 0–4, preferably 0, 1, or 4. In the preceding formula, when "Z'"" is present plurally (namely, b denotes an integer of 2–4) in a benzene ring, each Z' may be same or different. In the foregoing formula, the total of a and b ought to be invariably 4 (namely, a+b=4). The reason for this specific total is that the polyamide acid prefers the absence of a C—H bond therefrom in the light of the requirement that the finally produced polyimide should suffer only a low light loss in the light transmission wavelength. Thus, "X'" in the foregoing formula (1) most preferably denotes a divalent organic group represented by the following formula:

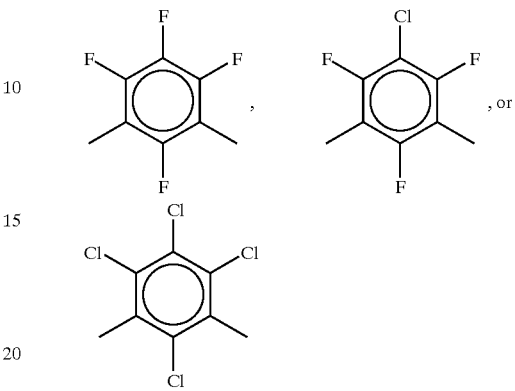

In the preceding formula (1), Y and Y' denote a chlorine, bromine, or iodine atom, preferably a chlorine or a bromine atom, and most preferably a chlorine atom. In this case, Y and Y' may be same or different. Then, in the preceding formula (1), p and p' each denote the number of fluorine atoms bonded to a relevant benzene ring, representing an integer of 0–3 and preferably 0 or 3. In this case, p and p' may be same or different. Further, in the preceding formula (1), q and q' respectively denote the numbers of the groups Y and Y' bonded to the relevant benzene ring, representing an integer of 0–3, preferably 0 or 3. In this case, q and q' may be same or different. In this formula, when Y and Y' are present plurally (namely q and q' both denote an integer of 2–3) in the benzene ring, Y and Y' may be same or different in the relevant benzene ring. In the preceding formula, the total of p and q ought to be invariably 3 (namely, p+q=3) and the total of p' and q' ought to be invariably 3 (namely p'+q'=3). The reason for these specific totals is that the polyamide acid prefers the absence of a C—H bond therefrom in the light of the requirement that the finally produced polyimide should suffer only a low light loss in the light communication wavelength.

To be specific, preferred examples of the polyamide acid of the first aspect of the invention are polyamide acids possessing a repeating unit represented by the preceding formula (3) and/or (3'), more preferable examples thereof are polyamide acids of the formula (3) and/or (3') wherein X and X' denote the divalent organic groups mentioned above, and particularly preferable examples thereof are polyamide acids possessing a repeating unit represented by any of the following formulas:

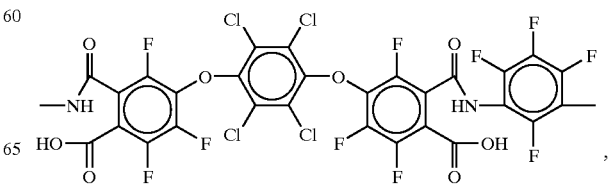
,

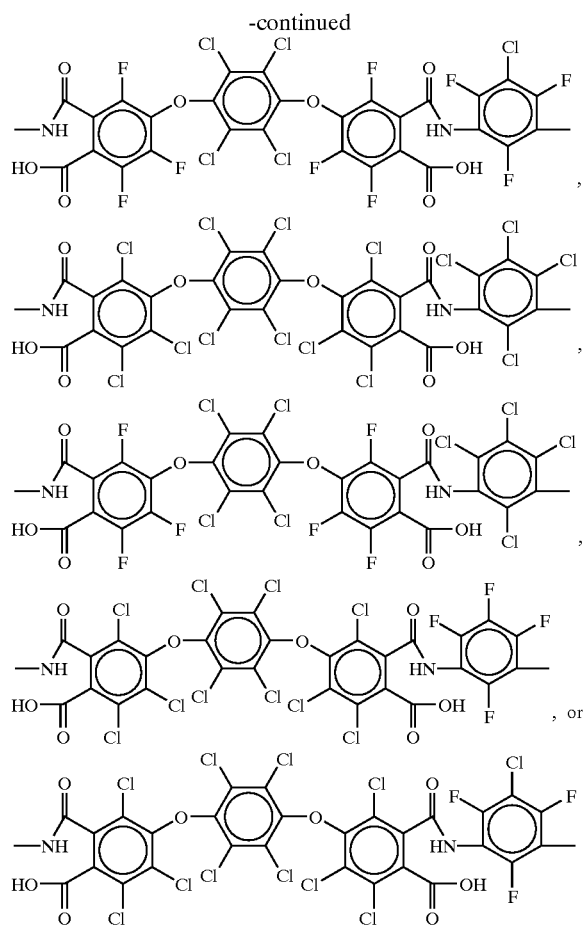
,

,

,

, or

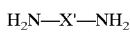

The method for the production of a polyamide acid of the first aspect of the invention will be described in detail below. From this description, the terminal of the polyamide acid of the first aspect of the invention may be inferred to be either an amine terminal or an acid derivative terminal, though variable with the quantities(molar ratios) of a diamine compound and a tetracarboxylic acid derivative to be added. Further, the polyamide acid of the first aspect of the invention may comprise one same repeating unit or different repeating units. In the latter case, the different repeating units may be connected to be a block polymer or a random polymer.

In the first aspect of the invention, the polyamide acid may contain perfluorinated repeating units [for example, a repeating unit of the formula (1) wherein X and X' each denote a perfluorinated divalent organic group having the hydrogen atoms (C—H bond) substituted wholly with fluorine atoms (C—F bond) and p and p' each denote 3] so long as at least one chlorine atom is present therein. The polyamide acid that is a copolymer containing partly therein a perfluorinated repeating unit is favorable to the first aspect of the invention in terms of solubility in organic solvents, heat resistance, and moisture absorption resistance. In this case, the repeating units (perfluorinated repeating units and not perfluorinated repeating units) may be connected to be a block polymer or a random polymer.

The polyamide acid of the first aspect of the invention can be produced by combining known techniques and the method for the production thereof does not need to be particularly restricted. Generally, the method which consists in causing a diamine compound represented by the following formula (5) to react with a tetracarboxylic acid represented by the following formula (7), an acid anhydride or an acid chloride thereof, or an esterification products thereof in an organic solvent is advantageously used. Specifically, the second aspect of the invention provides a method for the production of the polyamide acid mentioned above, which comprises causing a diamine compound represented by the following formula (5) (occasionally referred to simply as "diamine compound" herein) to react with a tetracarboxylic acid represented by the following formula (7), an acid anhydride or an acid chloride, or an esterification product thereof (occasionally referred to collectively as "tetracarboxylic acid derivative" herein) in an organic solvent.

$$H_2N-X'-NH_2 \tag{5}$$

(wherein X' denotes a divalent organic group.)

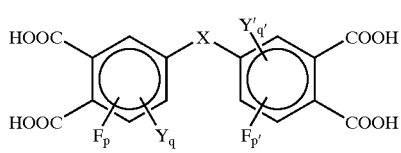

(7)

(wherein X denotes a divalent organic group; Y and Y' independently denote a chlorine, bromine, or iodine atom; p and p' independently denote the number of fluorine atom {F in the formula (7)} bonded to a relevant benzene ring, representing an integer of 0–3, q and q' independently denote an integer of 0–3; p+q total 3, and p'+q' total 3.)

Since "X'" in the preceding formula (5) and "X", "Y", "Y'", "p", "q", "p'", and "q'" in the preceding formula (7) have the same definitions as in the preceding formula (1), explanation for them will be omitted.

The second aspect of the invention will be described below with reference to the case of a polyamide acid of the preceding formula (1) wherein X' denotes a divalent group represented by the following formula:

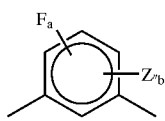

To be specific, the polyamide acid aimed at can be produced by causing 1,3-diaminobenzene derivative represented by the following formula (6):

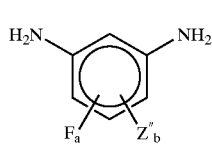

(6)

(which will be occasionally referred to simply as "1,3-diaminobenzene derivative" in the present specification) to react with a tetracarboxylic acid derivative of the preceding formula (7) in an organic solvent. Incidentally, the following mode of embodiment is a preferred example of the second aspect of the invention using the 1,3-diaminobenzene derivative as the raw material. The method of the second aspect of the invention, by using a properly selected diamine compound in the place of the 1,3-diaminobenzene derivative, can be implemented similarly to the following mode of embodiment. Since "Z", "a", and "b" in the preceding formula (6) have the same definitions as in the preferred example of "X'", explanation for them will be omitted.

In the second aspect of the invention, the 1,3-diaminobenzene derivative does not need to be particularly restricted but is only required to have a construction represented by the preceding formula (6) and an ability to react with a halogenated tetracarboxylic acid derivative and produce the polyamide acid aimed at. In the light of the preferred construction of a polyamide acid, 1,3-diamino-2,4,5,6-tetrafluorobenzene, 5-chloro-1,3-diamino-2,4,6-trifluorobenzene, 2,3,5,6-tetrachloro-1,3-diaminobenzene, 4,5,6-trichloro-1,3-diamino-2-fluorobenzene, 5-bromo-1,3-diamino-2,4,6-trifluorobenzene, and 2,4,5,6-tetrabromo-1,3-diaminobenzene are preferred and 1,3-dimino-2,4,5,6-tetrafluorobenzene and 5-chloro-1,3-diamino-2,4,6-trifluorobenzene are particularly preferred. These 1,3-diaminobenzene derivatives may be used either singly or in the form of a combination of two or more members.

The quantity of the 1,3-diaminobenzene derivative to be added in the second aspect of the invention does not need to be particularly restricted but is only required to be such as to react efficiently with a halogenated tetracarboxylic acid derivative. Specifically, the quantity of the 1,3-diaminobenzene derivative to be added is stoichiometrically equimolar with the halogenated tetracarboxylic acid derivative. This quantity is preferably in the range of 0.8–1.2 mols, more preferably in the range of 0.9–1.1 mol, based on the total number of mols of the halogenated tetracarboxylic acid derivative taken as one mol. If the quantity of the 1,3-diaminobenzene derivative to be added falls short of 0.8 mol, the shortage will be at a disadvantage in suffering the halogenated tetracarboxylic acid derivative to survive the reaction in an unduly large quantity, possibly complicating a step of purification, and occasionally preventing the degree of polymerization from increasing as required. Conversely, if this quantity exceeds 1.2 mols, the excess will be at a disadvantage in suffering the 1,3-diaminobenzene derivative to survive the reaction in an unduly large quantity, possibly complicating the step of purification, and occasionally preventing the degree of polymerization from increasing as expected.

The halogenated tetracarboxylic acid derivative of the second aspect of the invention is a halogenated tetracarboxylic acid represented by the preceding formula (7), an acid anhydride or an acid chloride thereof, or an esterification product thereof. As concrete examples of the halogenated tetracarboxylic acid derivative, halogenated tetracarboxylic acids of the preceding formula (7) such as hexafluoro-3,3',4,4'-biphenyl tetracarboxylic acid, hexachloro-3,3',4,4'-diphenyltetracarboxylic acid, bis(3,4-dicarboxytrifluorophenyl) sulfide, bis(3,4-dicarboxytrichlorophenyl) sulfide, 1,4-bis-(3,4-dicarboxytrifluorophenoxy) tetrafluorobenzene, 1,4-bis(3,4-dicarboxytrichlorophenoxy) tetra-fluorobenzene, 1,4-bis(3,4-dicarboxytrifluorophenoxy) tetrachlorobenzene, 1,4-bis(3,4-dicarboxy-trichlorophenoxy) tetrachlorobenzene, 3,6-difluoropyromellitic acid, 3,6-dichloropyromellitic acid, and 3-chloro-6-fluoroplyromellitic acid; corresponding acid dihydrides; corresponding acid chlorides, and corresponding esterification products such as methyl esters and ethyl esters may be cited. Among these halogenated tetracarboxylic acid derivatives enumerated above, hexafluoro-3,3',4,4'-biphenyl tetracarboxylic acid, 1,4-bis(3,4-dicarboxytrifluorophenoxy) tetrafluorobenzene, 1,4-bis(3,4-dicarboxytrifluorophenoxy) tetrachlorobenzene, and corresponding acid dianhydrides and acid chlorides are preferred and 1,4-bis(3,4-dicarboxytrifluorophenoxy) tetrafluorobenzene, 1,4-bis(3,4-dicarboxytrifluoro-phenoxy) tetrachlorobenzene, and corresponding acid dianhydrides and acid chlorides are particularly preferred. These halogenated tetracarboxylic acid derivatives may be used either singly or in the form of a mixture of two or more members.

The halogenated tetracarboxylic acid represented by the preceding formula (7) and used in the second aspect of the invention does not need to be particularly restricted. It can be produced by the method disclosed in JP-A-11-147955 or by any of known techniques or by combination thereof.

The organic solvent to be used in the second aspect of the invention does not need to be particularly restricted but is only required to promote efficiently the reaction of a 1,3-diaminobenzene derivative with a halogenated tetracarboxylic acid derivative and remain inactive to these raw materials. As concrete examples of the organic solvent answering the description, such polar organic solvents as N-methyl-2-pyrrolidinone, N,N-dimethyl acetamide, N,N-dimethyl formamide, dimethyl sulfoxide, sulfolane, methyl isobutyl ketone, acetonitrile, and benzonitrile may be cited. These organic solvents may be used either singly or in the form of a mixture of two or more members. The quantity of the organic solvent to be used does not need to be particularly restricted but is only required to promote efficiently the reaction of a 1,3-diaminobenzene derivative with a halogenated tetracarboxylic acid derivative. The concentration of the 1,3-diaminobenzene derivative in the organic solvent is properly in the range of 1–80% by mass, preferably in the range of 5–50% by mass.

The conditions for the reaction between the 1,3-diaminobenzene derivative and the halogenated tetracarboxylic acid derivative in the second aspect of the invention do not need to be particularly restricted but are only required to promote the reaction fully satisfactorily. For example, the reaction temperature is preferably in the range of 0–100° C., more preferably in the range of 10–50° C. Then, the reaction time is generally in the range of 1–240 hours, preferably in the range of 1–72 hours, and more preferably in the range of 2–48 hours. Though the reaction may be carried out under pressure, under normal pressure, or under reduced pressure, it is preferably performed under normal pressure. Further, the reaction of a 1,3-diaminobenzene derivative with a halogenated tetracarboxylic acid derivative is preferably performed under the atmosphere of dry inert gas in the light of the efficiency of reaction and the degree of polymerization. In this case, the relative humidity of the atmosphere of reaction is preferably not more than 10% and more preferably not more than 1%. As concrete examples of the insert gas to be used herein, nitrogen, helium, and argon may be cited.

In this invention, the novel polyimide can be prepared by subjecting the polyamide acid of the second aspect of the invention to ring closure by application of heat. To be specific, the third aspect of the invention provides a polyimide that contains a chlorine atom and a fluorine atom and comprises a repeating unit represented by the following formula (2).

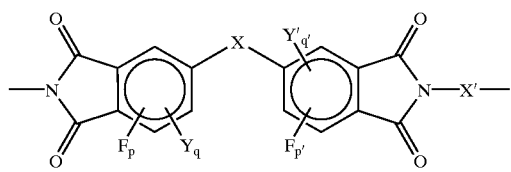

(2)

(wherein X and X' independently denote a divalent organic group; Y and Y' independently denote a chlorine, bromine, or iodine atom; p and p' independently denote the number of fluorine atom {F in the formula (2)} bonded to a relevant benzene ring, representing an integer of 0–3; q and q' independently denote an integer of 0–3; and p+q total 3 and p'+q' total 3.)

The third aspect of the invention also provides the polyimide that comprises a repeating unit represented by the following formula (4) and/or (4').

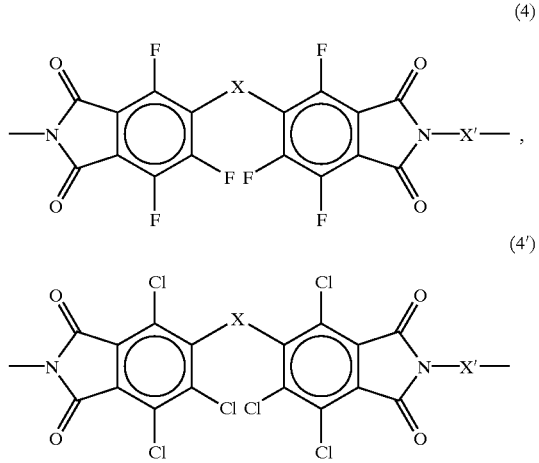

(4)

(4')

(wherein X and X' independently denote a divalent organic group.)

The polyimide which forms the carbon-fluorine bond (C—F bond) and/or carbon-chlorine bond (C—Cl bond) mentioned above and comprises a prescribed repeating unit excels in heat resistance, chemical resistance, water repellency, dielectric characteristics, electrical characteristics, and optical characteristics. Thus, it is useful as various optical materials such as printed wiring boards, LSI grade layer insulating films, sealing materials for semiconductor parts, optical parts, optoelectronic integrated circuits (OEIC), and optical wave guides for optoelectronic mixed packaging wiring boards.

In the third aspect of the invention, the polyimide is essentially required to contain a chlorine atom and a fluorine atom. In this case, the content of chlorine atoms in the polyimide does not need to be particularly restricted but may be properly selected in consideration of the ease of production and the necessary characteristics (for example, solubility, heat resistance, chemical resistance, water repellency, dielectric characteristics, electrical characteristics, and optical characteristics). The content of chlorine atoms in the polyimide is preferred to be not more than 60% by mass, based on the mass of the total quantity of the polyimide. If the content of chlorine atoms exceeds 60% by mass, the excess will be at a disadvantage in possibly increasing unduly the dielectric constant and the refractive index and in possibly degrading the heat resistance due to the decrease of the content of fluorine atoms in consequence of the increase of the content of chlorine atoms. Since the polyimide of the third aspect of the invention essentially contains a chlorine atom, the content of chlorine atoms in the polyimide will not reach 0% by mass. In the light of the dielectric constant, refractive index, heat resistance, and moisture absorption resistance of the polyimide, the content of chlorine atoms in the polyimide is more preferably in the range of 4–55% by mass and particularly preferably in the range of 4–30% by mass, based on the total mass of the polyimide.

Further, the polyimide in the third aspect of the invention essentially comprises a repeating unit represented by the preceding formula (2). The desired refractive index (namely, the refractive index difference, .n, relative to the existing perfluorinated polyimide) can be accomplished by the polyimide comprising a prescribed repeating unit. Further, the polyimide of the third aspect of the invention prefers the absence of a carbon-hydrogen bond (C—H bond) therefrom in consideration of light transmission loss in the near-infrared ray, particularly the light communication wavelength (1.0–1.7 $\mu$m). The polyimide that is endowed with this construction excels in heat resistance, chemical resistance, water repellency, dielectric characteristics, electrical characteristics, and optical characteristics. Incidentally, since "X", "X'", "Y", "Y'", "p", "p'", "q", and "q'" used in the preceding formula (2) have the same definitions as those in the preceding formula (1), explanation for them will be omitted.

As preferred examples of the polyimide of the third aspect of the invention, those polyimides that comprise a repeating unit represented by the preceding formula (4) and/or (4') may be cited. In the preceding formula (4) and/or (4'), "X" and "X'" have the same definitions as in the preceding formula (1). The preferred examples of the divalent organic group as "X" in the preceding formula (4) are direct bonds and divalent groups represented by the following formulas:

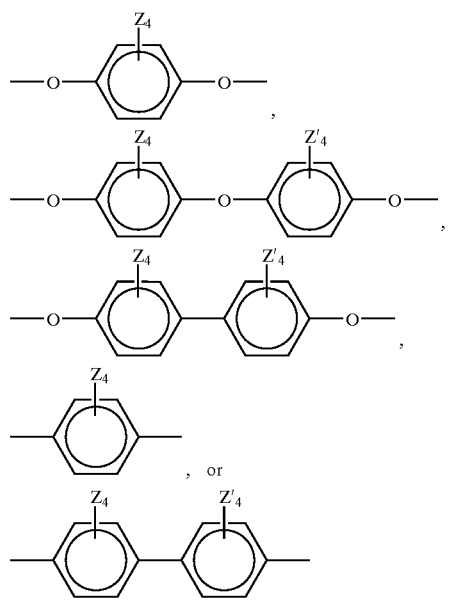

In these formulas, X is preferred to denote a direct bond or a divalent group represented by the following formula:

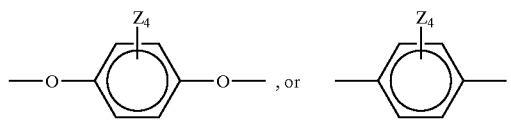 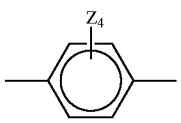

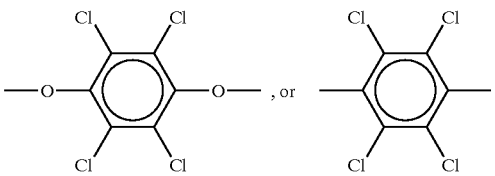

Specifically, X is preferred to denote a direct bond or a divalent organic group represented by any of the following formulas.

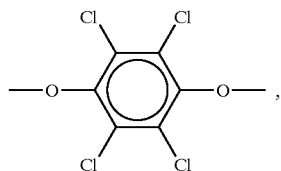

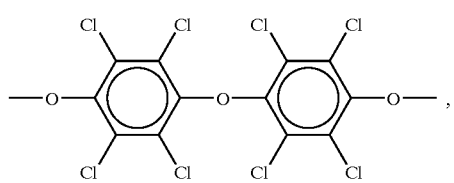

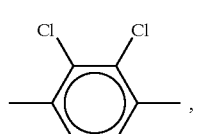

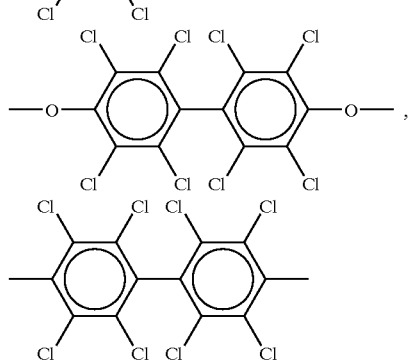

It more preferably denotes a divalent organic group represented by the following formula:

and particularly preferably a divalent organic group represented by the following formula:

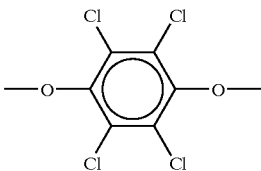

Then, in the preceding formula (4), X' has the same definition as in the preceding formula (1) and is preferred to denote a divalent organic group represented by the following formula:

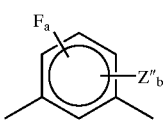

Specifically, it most preferably denotes a divalent group represented by the following formula:

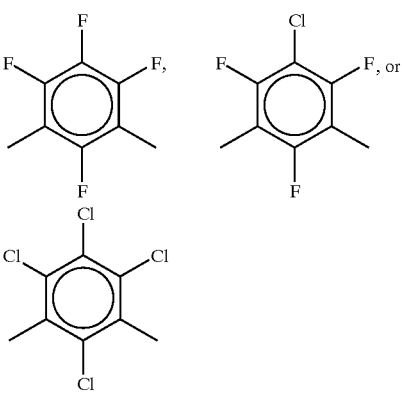

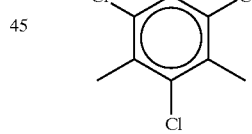

The polyimide of this invention is particularly preferably a polyimide comprising a repeating unit represented by any of the following formulas:

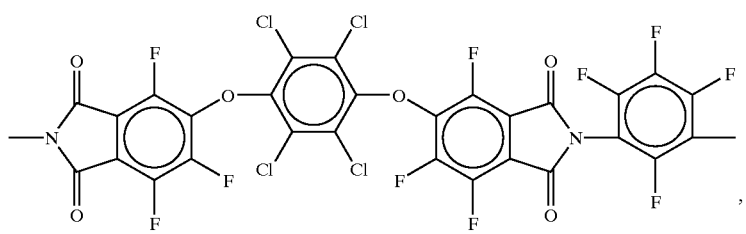

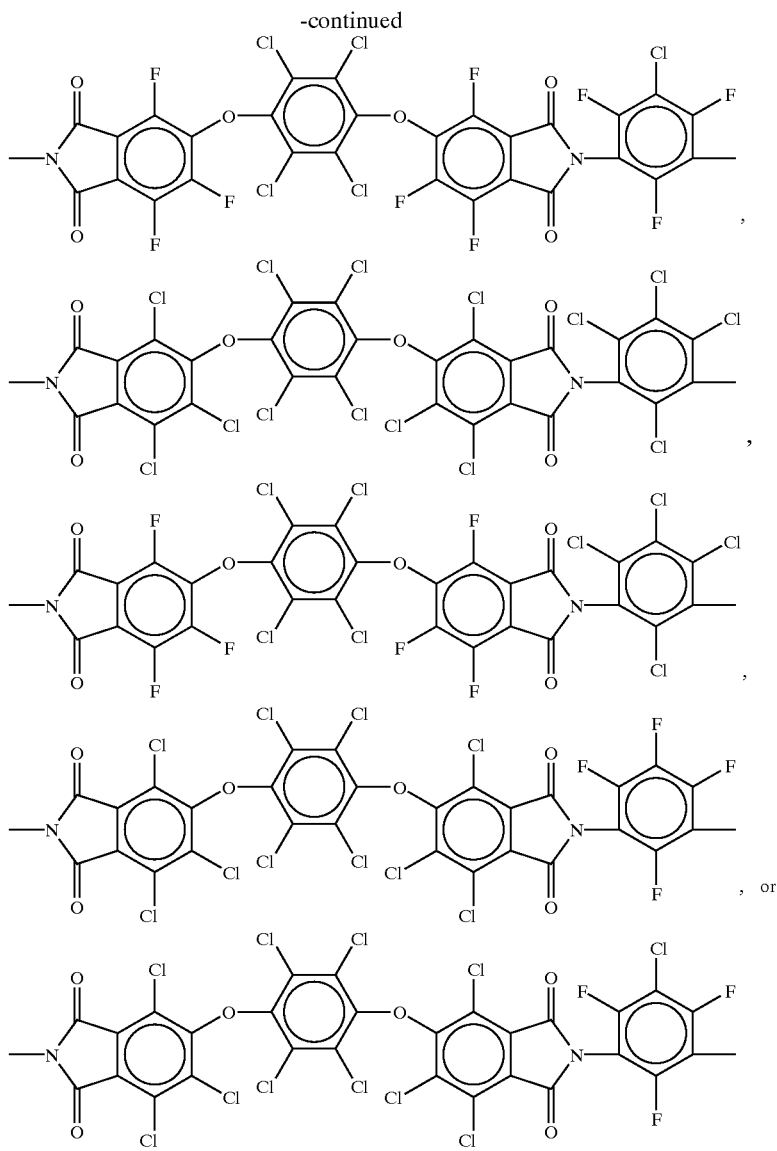

Incidentally, the polyimide of the third aspect of the invention is produced by subjecting a polyamide acid to ring closure by application of heat as will be described in detail below. From this fact, the terminal of the polyimide of this invention may be inferred to be an amine terminal or an acid derivative terminal, though variable with the construction of the polyamide acid to be used. The polyimide of the third aspect of the invention may comprise the same repeating unit or different repeating units. In the latter case, the repeating units may be connected to be a block polymer or a random polymer.

In the third aspect of the invention, the polyimide is allowed to comprise a perfluorinated repeating unit [for example, a repeating unit of the formula (2), wherein X and X' each denote a perfluorinated divalent organic group having all the hydrogen atoms (C—H bond) substituted with fluorine atoms (C—F bond) and p and p' each denote 3] so long as at least one chlorine atom is present therein. In this case, the repeating unit (perfluorinated repeating unit and non-perfluorinated repeating unit) may be connected to be a block polymer or a random polymer.

The polyimide of the third aspect of the invention can be produced by combining known techniques. Though the method for this production does not need to be particularly restricted, the production is generally effected by subjecting the polyamide acid of this invention to ring closure by application of heat. To be specific, the fourth aspect of the invention provides a method for the production of the polyimide contemplated by the third aspect of this invention that consists in subjecting the polyamide acid of the first aspect of this invention to ring closure by application of heat.

In this invention, the heat treatment of the polyamide acid may be carried out in a solvent or in the absence of a solvent. In consideration of such factors as the efficiency of reaction, however, it is preferably performed in a solvent. In this case, the polyamide acid may be subjected to the heat treatment in the form of the solution which is obtained in the aforementioned process for the production of a polyamide acid by the reaction of a 1,3-diaminobenzene derivative with a halogenated tetracarboxylic acid derivative or in the form of what is obtained by separating the polyamide acid in a solid form from the solution and redissolving the solid polyamide acid in a solvent. As concrete examples of the other solvent to be used in the latter case, polar solvents such as N-methyl-2- pyrrolidinone, N,N-dimethyl acetamide, acetonitrile, benzonitrile, nitrobenzene, nitro-methane, dimethyl sulfoxide, acetone, methyl ethyl ketone, isobutyl ketone, and methanol; and non-polar solvents such as toluene and xylene may be cited. Among these solvents enumerated above, N-methyl-2-pyrrolidinone and N,N-dimethyl acetamide are preferably used. These solvents may be used either singly or in the form of a mixture of two or more members.

The conditions for the heat treatment of the polyamide acid in the fourth aspect of this invention do not need to be particularly restricted but are only required to effect efficiently the ring closure of the polyamide acid and accomplish the consequent production of the polyimide aimed at. Specifically, the heat treatment is performed generally in the air and preferably in the atmosphere of an inert gas such as nitrogen, helium, or argon at a temperature in the approximate range of 70–350° C. for a period in the approximate range of 2–5 hours. The heat treatment of this invention may be carried out stepwise or continuously. In a preferred embodiment, the heat treatment of the polyamide acid is carried out stepwise, namely at 70° C. for two hours, at 160° C. for one hour, at 250° C. fo 30 minutes, and at 350° C. for one hour.

The polyimide of the fourth aspect of the invention excels in chemical resistance, water repellency, dielectric characteristics, electrical characteristics, and optical characteristics. Further, the polyimide of the fourth aspect of the invention, particularly when it has no carbon-hydrogen bond (C—H bond) in the molecular chain thereof, does not show in the absorption spectrum thereof in the near infrared range a peak originating in the higher harmonic wave of a C—H bond stretching vibration, or originating in the combination vibration of the higher harmonic wave of a C—H bond stretching vibration and deformation vibration. Since the polyimide, therefore, can accomplish a low light loss throughout the whole light communication wavelength (1.0–1.7 μm), it is useful for various optical materials such as, printed wiring boards, LSI grade layer insulating films, sealing materials for semiconductor parts, optical parts, optoelectronic integrated circuits (OEIC), and optical wave guides for optoelectronic mixed packaging wiring boards.

The fifth aspect of the invention provides an optical material containing the polyimide of the third aspect of the invention.

The optical material of the fifth aspect of the invention essentially contains the polyimide of the third aspect of this invention. It may additionally contain other components with the object of further improving necessary characteristics such as light transmittance, heat resistance, chemical resistance, water repellency, dielectric characteristics, electrical characteristics, and optical characteristics. As concrete examples of such other components, polyamide, polyamide-imide, epoxy resin, phenol resin, melamine resin, urea resin, diallyl phthalate resin, unsaturated polyester resins, urethane resin, addition type polyimide resin, silicone resin, polyparavinyl phenol resin, polyphenylene sulfide, polyether, polyether ether ketone, polypropylene, and polyazomethine; fluorocarbon resins such as polytetrafluoroethylene (PTFE), tetrafluoroethylene-hexafluoro-propylene copolymer (FEP), ethylene-tetrafluoroethylene copolymer (ETFE), tetrafluoroethylene-perfluoroalkylvinyl ether copolymers (PFA), and polychlorotrifluoroethylene (PCTFE); inorganic fillers such as powders and short fibers of calcium carbonate, silica, alumina, titania, aluminum hydroxide, aluminum silicate, zirconium silicate, zircon, glass, talc, mica, graphite, aluminum, copper, and iron; mold release agents such as fatty acids and waxes; coupling agents such as epoxy silane, vinyl silane, borane type compounds and alkyl titanate type compounds; flame retardants such as antimony or phosphorus compounds and halogen-containing compounds; and various additives such as dispersants and solvents may be cited.

The method for applying the optical material of this invention is identical with the conventional method except the use of the polyimide of the third aspect of this invention. When the optical material of this invention is used for a printed wiring board, for example, a polyimide film can be formed on a substrate by coating the substrate with a polyamide acid solution by a known method such as, for example, casting, spin coating, roll coating, spray coating, bar coating, flexographic printing, or dip coating and then heating the applied coat on the substrate in the atmosphere of an inert gas such as nitrogen, helium, or argon at a temperature in the range of 70–350° C. for a period in the range of 2–5 hours. In the method described above, the polyamide acid solution may be in the form of the solution which is obtained in the aforementioned process for the production of a polyamide acid by the reaction of a 1,3-diaminobenzene derivative with a halogenated tetracarboxylic acid derivative or in the form of what is obtained by separating the polyamide acid in a solid form from the solution and redissolving the solid polyamide acid in a solvent. As concrete examples of these solvents to be used in the latter case, polar solvents such as N-methyl-2-pyrrolidinone, N,N-dimethyl acetamide, acetonitrile, benzonitrile, nitrobenzene, nitro-methane, dimethyl sulfoxide, acetone, methyl ethyl ketone, isobutyl ketone and methanol; and non-polar solvents such as toluene and xylene may be cited. Among these solvents enumerated above, N-methyl-2-pyrrolidinone and N,N-dimethyl acetamide are preferably used. These solvents may be used either singly or in the form of a mixture of two or more members. Incidentally, in the method described above, the thickness of the film, for example, may be properly selected to suit the purpose for which the film is used. The known size may be similarly used.

The sixth aspect of this invention is a polyamide acid comprising a repeating unit represented by the following formula (i):

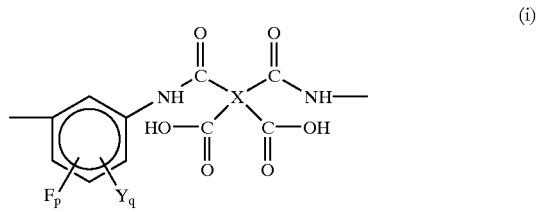

(i)

(wherein X denotes a tetravalent organic group; Y denotes a chlorine, bromine, or iodine atom; p denotes the number of fluorine atom {F in the formula (i)} bonded to a relevant benzene ring, representing an integer of 0–3; q denotes an integer of 1–4; and p+q totals 4.)

Further, the sixth aspect of the invention is a polyamide acid that comprises a repeating unit represented by the following formula (v):

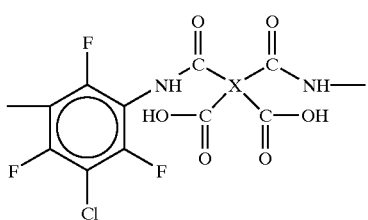

(wherein X denotes a tetravalent organic group.)

The sixth aspect of the invention concerns the polyamide acid represented by the preceding formula(i). The polyamide acid that possesses this construction is useful as the raw material for the polyimide that excels in heat resistance, chemical resistance, water repellence, dielectric characteristics, electrical characteristics, and optical characteristics.

In the preceding formula (i), X denotes a tetravalent organic group. As concrete examples of the tetravalent organic group, tetravalent aliphatic organic groups derived from cycloalkyl, chain alkyl, olefins, and glycols; tetravalent aromatic organic groups derived from benzene biphenyl, biphenyl ether, bisphenyl benzene, and bisphenoxy benzene; and halogen-containing aliphatic and aromatic organic groups thereof may be cited. In these tetravalent organic groups, preferably tetravalent aromatic organic groups and more preferably tetravalent halogen-containing aromatic organic groups are denoted by "X" in the preceding formula (i). As preferred examples of the tetravalent organic groups as "X" in the preceding formula (i), the tetravalent groups that are represented by the following formula may be cited.

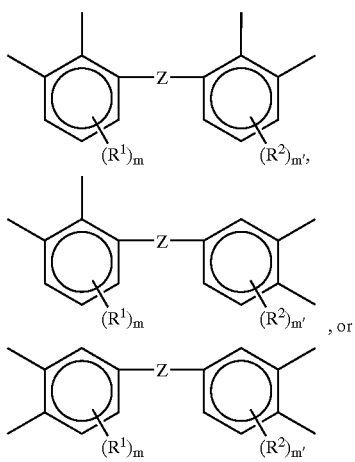

In the tetravalent organic groups as X in the preceding formula (i), $R^1$ and $R^2$ each denote a halogen, namely a fluorine, chlorine, bromine, or iodine atom, preferably a fluorine or chlorine atom, and most preferably a fluorine atom. In this case, $R^1$ and $R^2$ may be same or different. When $R^1$ and $R^2$ are plurally present in the relevant benzene rings (namely when m and m' each denote 2 or 3), these $R^1$ and $R^2$ may be same or different in the relevant benzene rings. Then, m and m' respectively denote the numbers of $R^1$ and $R^2$ bonded to the relevant benzene rings, each representing an integer of 1–3. This integer is preferably 3 in view of the fact that the absence of a C—H bond is favorable in the light of such factors as heat resistance, chemical resistance, water repellency, and low permittivity. In this case, m and m' may denote one same integer or different integers.

Further, in the preceding formula, Z denotes a bond or a divalent group represented by the following formula:

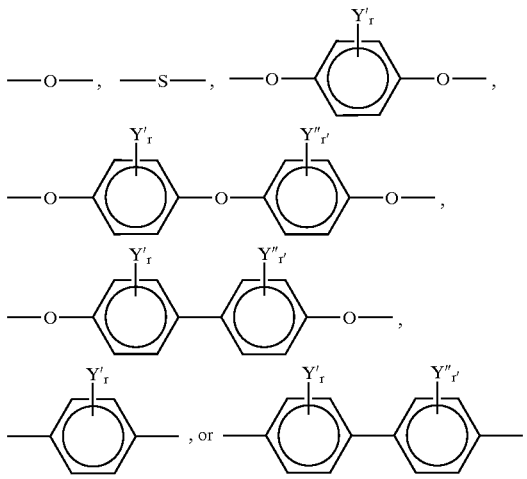

Preferably, Z denotes a direct bond or a divalent group represented by the following formula:

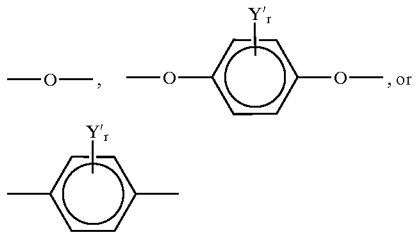

In the preceding formulas that represent Z, Y' and Y" each denote a halogen atom, namely a fluorine, chlorine, bromine, or iodine atom, preferably a fluorine or chlorine atom, and most preferably a fluorine atom. When Y' and Y" are both present in any of the preceding formulas that represent Z, Y' and Y" may be same or different. When Y' and Y" are present plurally in the relevant benzene rings (namely, r and r' each denote an integer of 2–4), Y' and Y" may be same or different in the relevant benzene rings. Then, r and r' respectively denote the numbers of Y' and Y' bonded to the relevant benzene rings, representing an integer of 1–4, preferably 2–4. This integer is most preferably 4 in view of the fact that the absence of a C—H bond is favorable in the light of such factors as heat resistance, chemical resistance, water repellency, and low permittivity. In this case, r and r' may denote one same integer or different integers.

In the preceding formula (i), Y denotes a chlorine, bromine, or iodine atom, preferably a chlorine or bromine atom, and most preferably a chlorine atom. Then, in the preceding formula (i), p denotes the number of fluorine atoms bonded to the relevant benzene ring, representing an integer of 0–3, preferably 1–3, and more preferably 3. Further, in the preceding formula (i), q denotes the number of Y bonded to the relevant benzene ring, representing an integer of 1–4, preferably 1–3, and more preferably 1. When Y is present plurally in the relevant benzene ring (namely, q denotes an integer of 2–4) in the preceding formula, each Y may be same or different in the relevant benzene ring. In the preceding formula (i), the total of p and q is invariably 4

(namely, p+q=4). The reason is that the absence of a C—H bond from the polyamide acid is advantageous in the light of heat resistance, chemical resistance, water repellency, and low permittivity which the finally produced polyimide is expected to exhibit.

As preferred examples of the polyamide acid of the sixth aspect of the invention, the polyamide acids that possess a repeating unit represented by the preceding formula (v) may be cited. More preferably, the polyamide acids that possess a repeating unit represented by the following formulas:

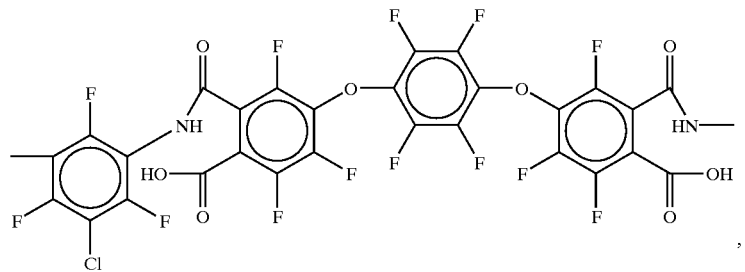
(V-1)

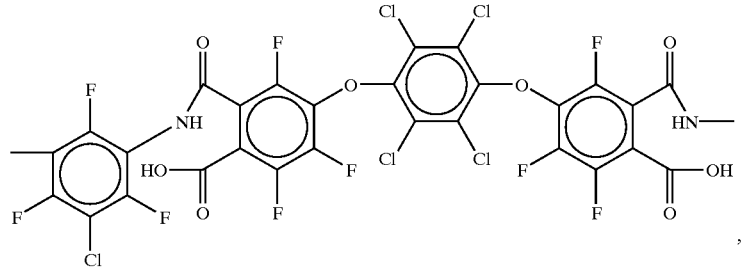
(V-2)

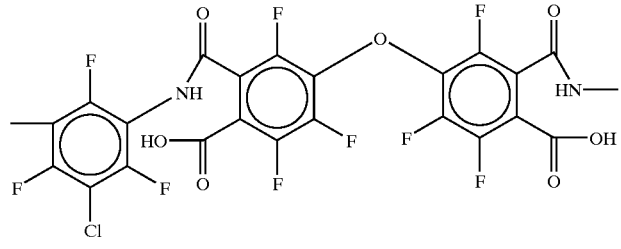
(V-3)

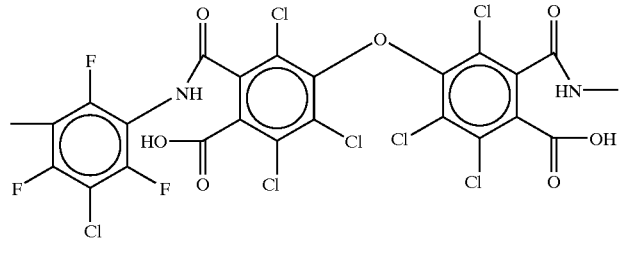
(V-4)

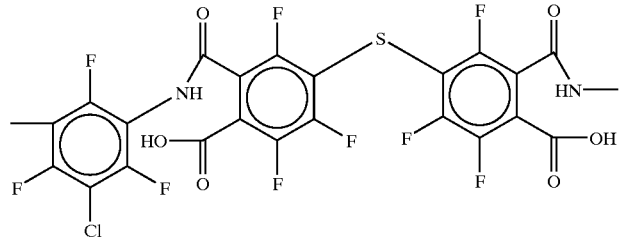
(V-5)

(V-6)
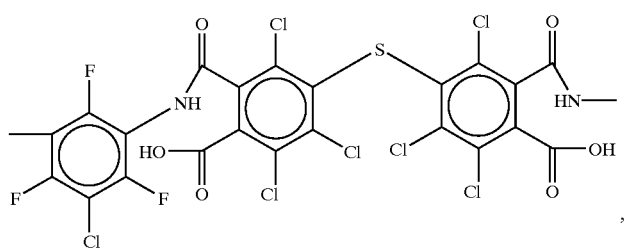
,
(V-7)
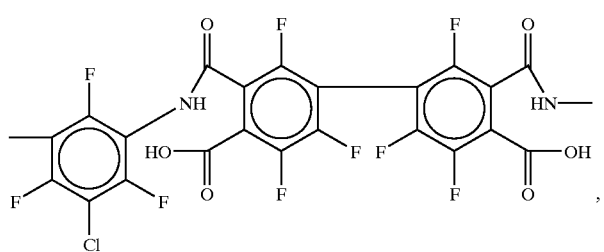
,
(V-8)
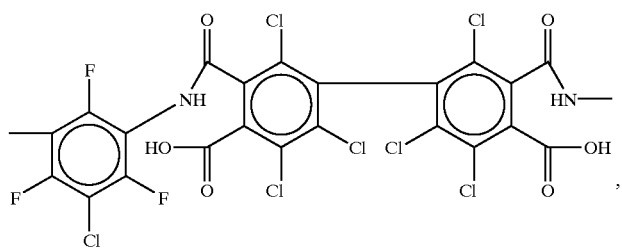
,
(V-9)
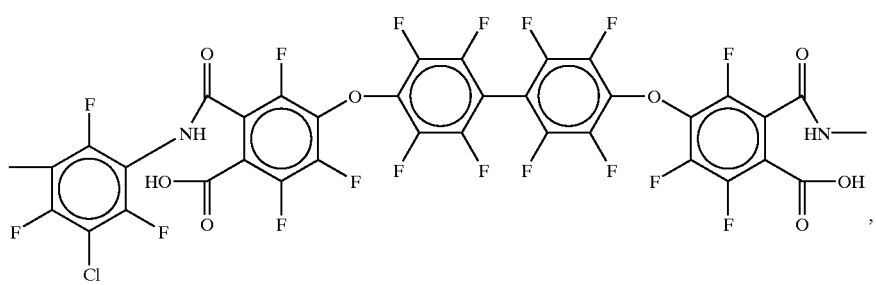
,
(V-10)
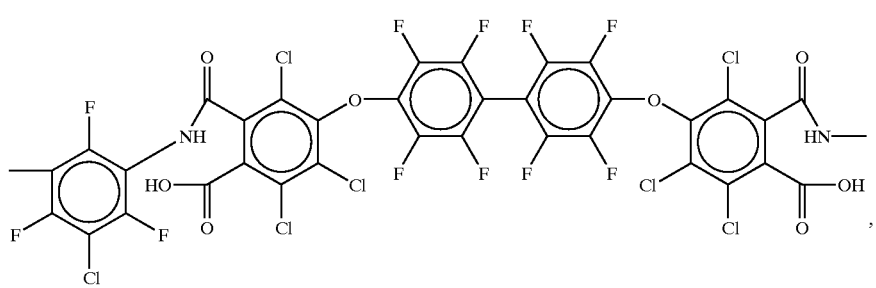
,
(V-11)
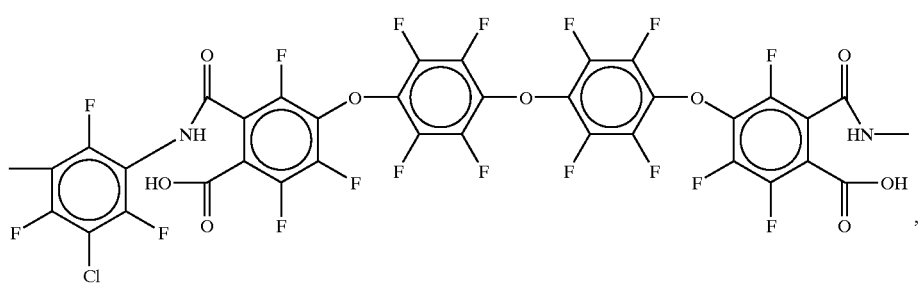
, -continued

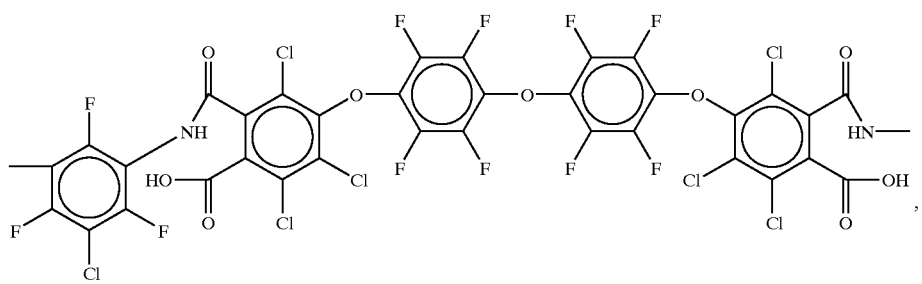
(V-12)

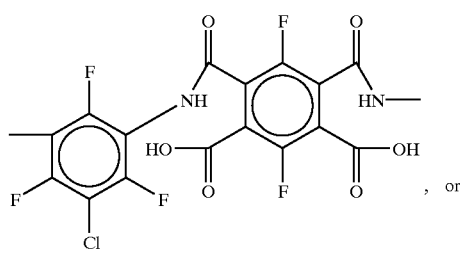
(V-13)

, or

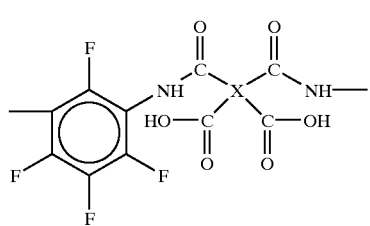
(V-14)

may be cited. Among these polyamide acids enumerated above, the polyamide acids that possess a repeating unit represented by the preceding formulas (V-1)–(V-3) prove particularly advantageous.

The method for producing the polyamide acid contemplated by the sixth aspect of the invention will be described in detail below. From this description, it ought to be inferred that the terminal of the polyamide acid of the sixth aspect of the invention is either an amine terminal or an acid derivative terminal, though variable with the quantities (molar ratios) of the 1,3-diaminobenzene derivative and the halogenated tetracarboxylic acid derivative to be added. The polyamide acid of the sixth aspect of the invention may comprise the same repeating unit or two or more kinds of repeating units. In the latter case, the repeating units may be connected to be a block polymer or a random polymer.

The polyamide acid of the sixth aspect of the invention may comprise a repeating unit containing a perfluorinated benzene ring and represented by the preceding formula (ii) besides the repeating unit represented by the formula (i).

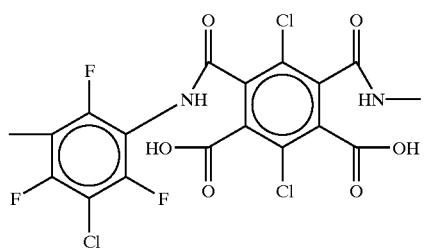
(ii)

The polyamide acid that is thus endowed with the form of a copolymer comprising the repeating units of the former (i) and the formula (ii) as described above is advantageous for this invention in the light of the solubility in an organic solvent, heat resistance, and moisture absorption resistance. In this case, the repeating units of the formula (i) and the formula (ii) may be connected to be a block polymer or a random polymer.

The polyamide acid of the sixth aspect of the invention can be produced by combining known techniques. The method used for producing this polyamide acid is not particularly restricted. Generally, the method which comprises causing a 1,3-diaminobenzene derivative represented by the following formula (vii) to react with a halogenated tetracarboxylic acid represented by the following formula (viii) or an acid anhydride or an acid chloride, or an esterification product thereof in an organic solvent can be advantageously used. Specifically, the seventh aspect of this invention is a method for the production of the aforementioned polyamide acid, which comprises causing a 1,3-diaminobenzene derivative represented by the following formula (vii) (occasionally referred to simply as "1,3-diaminobenzene derivative" herein) to react a halogenated tetracarboxylic acid represented by the following formula (viii), or an acid anhydride or an acid chloride, or an esterification product thereof (occasionally referred to collectively as "halogenated tetracarboxylic acid derivative" herein) in an organic solvent.

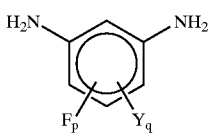

(vii)

(wherein Y denotes a chlorine, bromine, or iodine atom; p denotes the number of fluorine atom {F in the formula (vii)} bonded to the relevant benzene ring, representing an integer of 0–3; q denotes an integer of 1–4; and p+q total 4.)

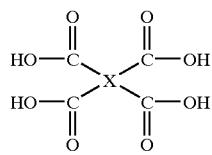

(viii)

(wherein X denotes a tetravalent organic group.)

Incidentally, "Y", "p", and "q" in the preceding formula (vii) and "X" in the preceding formula (viii) have the same definitions as in the preceding formula (i).

In the seventh aspect of the invention, the 1,3-diaminobenzene derivative does not need to be particularly restricted but is only required to possess such a construction as is represented by the preceding formula (vii) and is capable of reacting with a halogenated tetracarboxylic acid derivative and producing a polyamide acid aimed at. In the light of the preferred construction of the polyamide acid of the seventh aspect of the invention, 5-chloro-1,3-diamino-2,4,6-trifluorobenzene, 2,4,5,6-tetrachloro-1,3-diaminobenzene, 4,5,6-trichloro-1,3-diamino-2-fluorobenzene, 5-bromo-1,3-diamino-2,4,6-trifluorobenzene, and 2,4,5,6-tetrabromo-1,3-diaminobenzene prove advantageous and 5-chloro-1,3-diamino-2,4,6-trifluorobenzene proves particularly advantageous. These 1,3-diaminobenzene acid derivatives may be used either singly or in the form of a mixture of two or more members.

In the seventh aspect of this invention, the quantity of the 1,3-diaminobenzene derivative to be added does not need to be particularly restricted but is only required to be sufficient for inducing an efficient reaction with a halogenated tetracarboxylic acid derivative. Specifically, the quantity of the 1,3-diaminobenzene derivative to be added is stoichiometrically equimolar with the halogenated tetracarboxylic acid derivative. This quantity is preferably in the range of 0.8–1.2 mols, more preferably in the range of 0.9–1.1 mol, based on the total number of mols of the halogenated tetracarboxylic acid derivative taken as one mol. If the quantity of the 1,3-diaminobenzene derivative to be added falls short of 0.8 mol, the shortage will be at a disadvantage in suffering the halogenated tetracarboxylic acid derivative to survive the reaction in an unduly large quantity, possibly complicating a step of purification, and occasionally preventing the degree of polymerization from increasing. Conversely, if this quantity exceeds 1.2 mols, the excess will be at a disadvantage in suffering the 1,3-diaminobenzene derivative to survive the reaction in an unduly large quantity, possibly complicating the step of purification, and occasionally preventing the degree of polymerization from increasing.

In the seventh aspect of this invention, the halogenated tetracarboxylic acid derivative is a halogenated tetracarboxylic acid represented by the preceding formula (viii), an acid anhydride or an acid chloride thereof, or an esterification product thereof. As concrete examples of the halogenated tetracarboxylic acid derivative contemplated herein, halogenated tetracarboxylic acids of the preceding formula (viii) such as hexafluoro-3,3',4,4'-biphenyl tetracarboxylic acid, hexachloro-3,3',4,4'-biphenyl tetracarboxylic acid, hexafluoro-3,3',4,4'-biphenyl ether tetracarboxylic acid, hexachloro-3,3',4,4'-biphenyl ether tetracarboxylic acid, bis (3,4-dicarboxytrifluorophenyl) sulfide, bis(3,4-dicarboxytrichlorophenyl) sulfide, 1,4-bis(3,4-dicarboxytrifluorophenoxy) tetrafluoro-benzene, 1,4-bis(3,4-dicarboxytrichlorophenoxy) tetrafluorobenzene, 1,4-bis(3,4-dicarboxytrifluoro-phenoxy) tetrachlorobenzene, 1,4-bis (3,4-dicarboxytrichlorophenoxy) tetrachlorobenzene, 3,6-difluoropyromellitic acid, 3,6-dichloropyromellitic acid, and 3-chloro-6-fluoropyromellitic acid; corresponding acid dianhydrides; corresponding acid chlorides; and the corresponding esterification products such as methyl esters and ethyl esters may be cited. Among these halogenated tetracarboxylic acid derivatives enumerated above, hexafluoro-3,3',4,4'-biphenyl tetracarboxylic acid, hexafluoro-3,3',4,4'-biphenyl ether tetracarboxylic acid, 1,4-bis(3,4-dicarboxytrifluorophenoxy) tetrafluorobenzene, 1,4-bis(3,4-dicarboxytrifluorophenoxy) tetrachlorobenzene, and corresponding acid dianhydrides and acid chlorides prove advantageous and hexafluoro-3,3',4,4'-biphenyl ether tetracarboxylic acid, 1,4-bis(3,4-dicarboxytrifluorophenoxy) tetrafluorobenzene, 1,4-bis(3,4-dicarboxytrifluorophenoxy) tetrachlorobenzene, and acid dianhydrides thereof prove particularly advantageous. These halogenated tetracarboxylic acid derivatives may be used either singly or in the form of a mixture of two or more members.

The halogenated tetracarboxylic acid represented by the preceding formula (viii) and used in the seventh aspect of the invention does not need to be particularly restricted. It can be produced by combining known techniques including the method disclosed in JP-A-11-147955.

The organic solvent to be used in the seventh aspect of this invention does not need to be particularly restricted but is only required to promote efficiently the reaction of a 1,3-diaminobenzene derivative with a halogenated tetracarboxylic acid derivative and exhibit inactivity to the raw materials for the reaction. As concrete examples of the organic solvent, such polar organic solvents as N-methyl-2-pyrrolidinone, N,N-dimethyl acetamide, N,N-dimethyl formamide, dimethyl sulfoxide, sulfolane, methyl isobutyl ketone, acetonitrile, and benzonitrile may be cited. These organic solvents may be used either singly or in the form of a mixture of two or more members. Though the quantity of the organic solvent to be used does not need to be particularly restricted but is only required to promote efficiently the reaction of a 1,3-diaminobenzene derivative with a halogenated tetracarboxylic acid derivative, it is preferred to be such that the concentration of the 1,3-diaminobenzene derivative in the organic solvent may be in the range of 1–80% by mass and more advantageously in the range of 5–50% by mass.

In the seventh aspect of this invention, the conditions for the reaction of a 1,3-diaminobenzene derivative with a halogenated tetracarboxylic acid derivative do not need to be particularly restricted but are only required to promote the reaction fully satisfactorily. For example, the reaction temperature is preferably in the range of 0–100° C. and more preferably in the range of 10–50° C. The reaction time is generally in the range of 1–240 hours, preferably in the range of 1–72 hours, and more preferably in the range of 2–48 hours. Though the reaction may be carried out under pressure, under normal pressure, or under reduced pressure, it is preferably performed under normal pressure. The reaction of a 1,3-diaminobenzene derivative with a halogenated tetracarboxylic acid derivative is preferred to be performed under an atmosphere of a dry inert gas in the light of such factors as the efficiency of reaction and the water absorbency. The relative humidity in the atmosphere of this reaction is preferably not more than 10% and more preferably not more than 1%. As concrete examples of the inert gas to be preferably used herein, nitrogen, helium, and argon may be cited.

This invention permits a novel polyimide to be prepared by subjecting the polyamide acid of the sixth aspect of the invention or the polyamide acid produced by the method of the seventh aspect of this invention to ring closure by application of heat.

The eighth aspect of this invention, therefore, is a polyimide comprising a repeating unit represented by the following formula (iii).

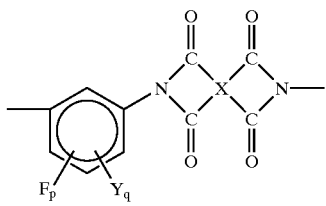

(iii)

(wherein X denotes a tetravalent organic group; Y denotes a chlorine, bromine, or iodine atom; p denotes the number of fluorine atom {F in the formula (iii)} bonded to the relevant benzene ring, representing an integer of 0–3; q denotes an integer of 1–4; and p+q total 4.)

Further, the eighth aspect of the invention is a polyimide comprising a repeating unit represented by the following formula (vi):

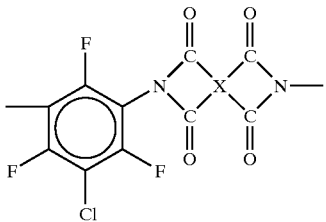

(vi)

(wherein X denotes a tetravalent organic group.)

The ninth aspect of this invention provides a method for the production of the polyimide of the eighth aspect of this invention, which comprises subjecting the polyamide acid of the sixth aspect of the invention or the polyamide acid produced by the method of the seventh aspect of this invention to ring closure by application of heat. The polyimide of this construction excels in heat resistance, chemical resistance, water repellency, dielectric characteristics, electrical characteristics, and optical characteristics. Incidentally, "X", "Y", "p", and "q" in the preceding formula have the same definitions as in the preceding formula (i).

In the eighth aspect of this invention, the polyimide is not particularly restricted but is only required to be represented by the preceding formula (iii). It is preferred to be endowed with a construction containing no C—H bond in the light of heat resistance, chemical resistance, water repellency, and low permittivity.

To be specific, as preferred examples of the polyimide of the eighth aspect of this invention, those polyimides that comprise a repeating unit represented by the preceding formula (vi) may be cited. In the preceding formula (vi), "X" has the same definition as in the sixth aspect of this invention {the preceding formula (i)}. That is, "X" in the preceding formula (vi) denotes a tetravalent aromatic organic group, preferably a tetravalent halogen-containing aromatic organic group. As preferred examples of the tetravalent organic group as X in the preceding formula (vi), tetravalent groups represented by the following formula may be cited:

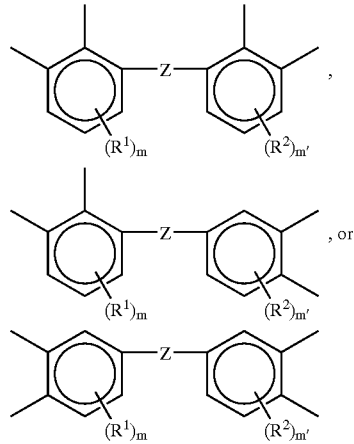

In the formulas representing the tetravalent organic groups as X in the preceding formula (vi), Z, $R^1$, $R^2$, m, and m' have the same definitions as in the formulas representing the tetravalent organic groups as X in the preceding formula (i). Therefore, explanation for them will be omitted.

As preferred examples of the polyimides of the eighth aspect of the invention, the polyimides comprising a repeating unit represented by the following formulas may be cited.

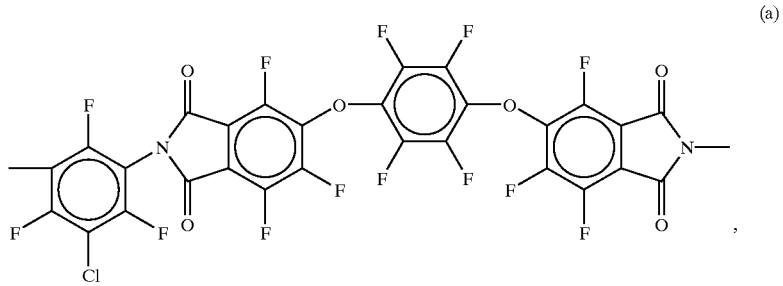

(a)

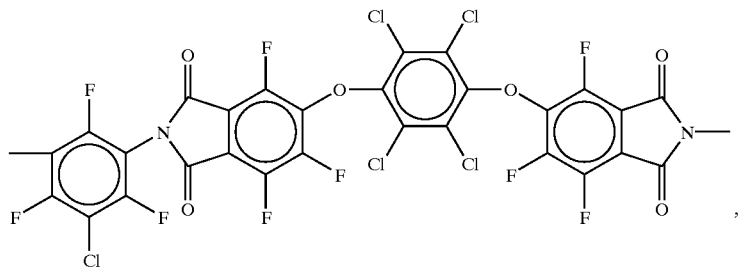
(b)
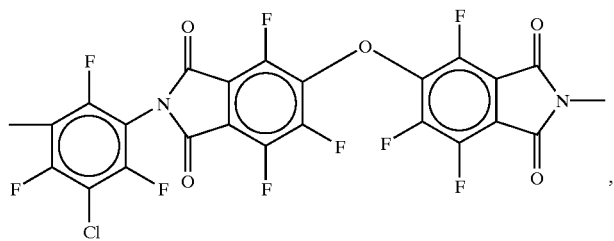
(c)
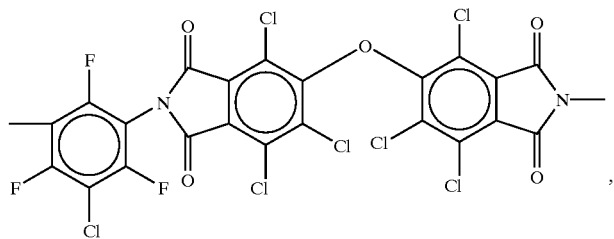
(d)
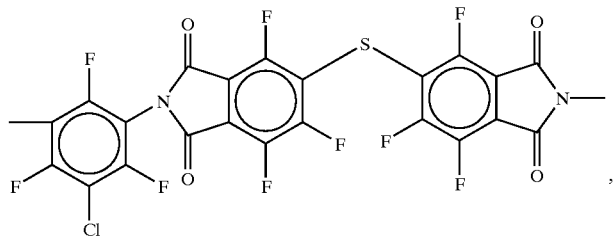
(e)
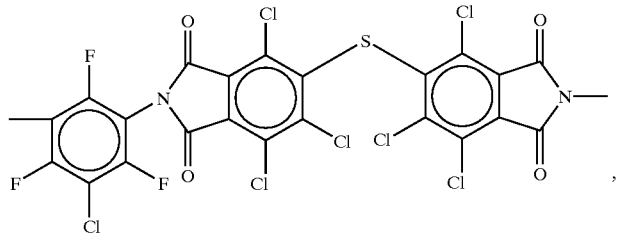
(f)
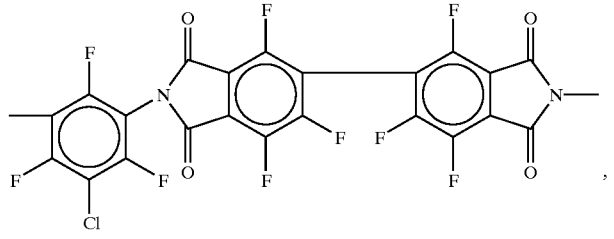
(g)

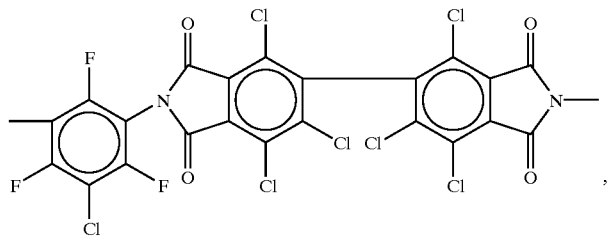
(h)
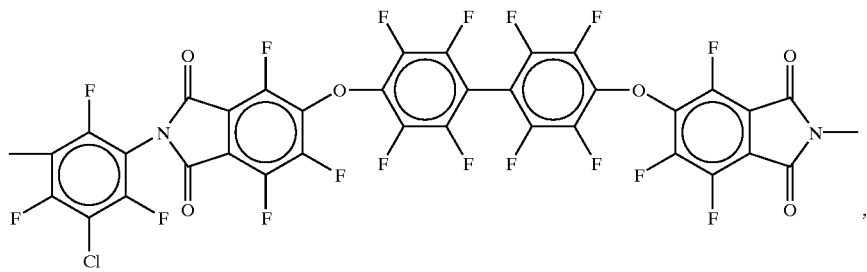
(i)
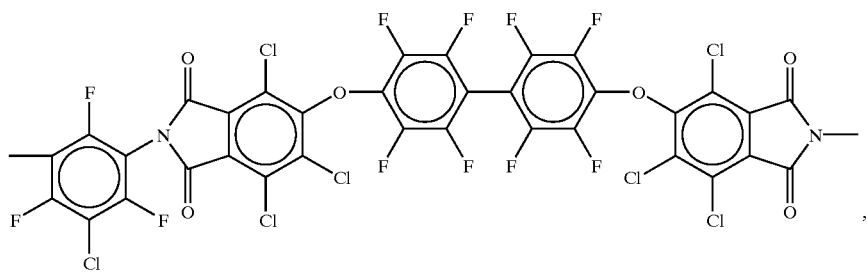
(j)
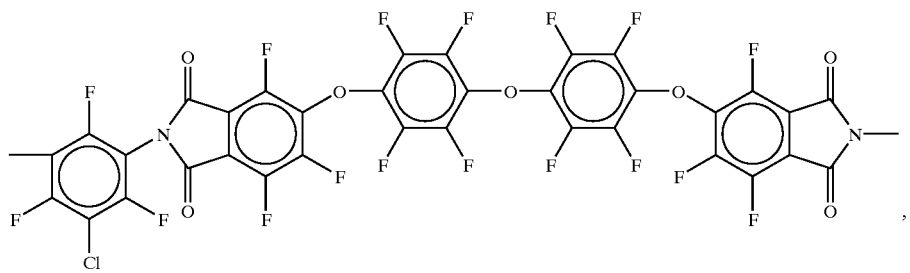
(k)
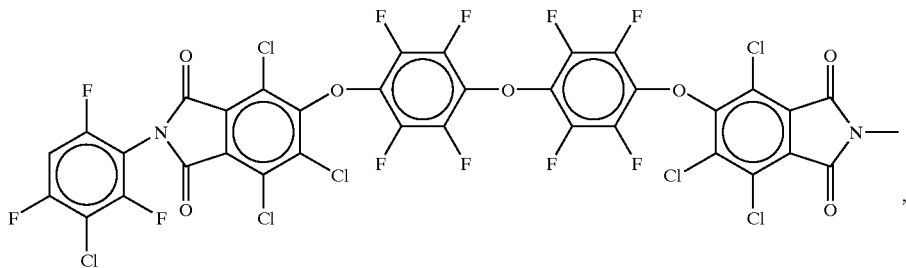
(l)
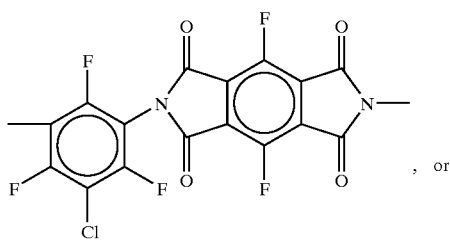
(m)
, or -continued

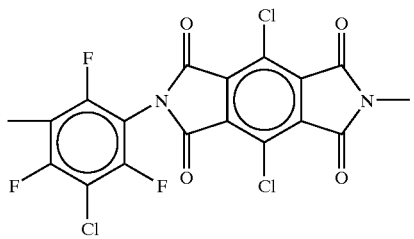

Among these polyimides enumerated above, the polyimides comprising a repeating unit represented by the preceding formulas (a)–(c) prove particularly advantageous.

Incidentally, the polyimide of the eighth aspect of the invention is produced by subjecting the polyamide acid of the sixth aspect of the invention to ring closure by application of heat. It is inferred that the terminal of the polyimide of the polyimide of the eighth aspect of the invention is an amine terminal or an acid derivative terminal, though variable with the construction of the polyamide acid to be used. Further, the polyimide of the polyimide of the eighth aspect of the invention may comprise the same unit or two or more kinds of repeating units. In the latter case, the repeating units may be connected to be a block polymer or a random polymer.

The polyimide of the eighth aspect of this invention may comprise a repeating unit having perfluorinated benzene rings and represented by the following formula (iv).

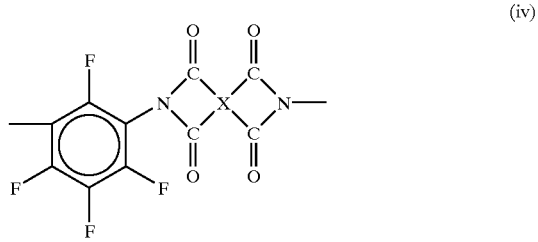

(wherein X denotes a tetravalent organic group.)

The polyimide endowed with the construction of a copolymer comprising a repeating unit of the formula (iii) and the formula (iv) as described above is advantageous for this invention in the light of the solubility in an organic solvent, heat resistance, and moisture absorption resistance. In this case, the repeating units of the formula (iii) and the formula (iv) may be connected to be a block polymer or a random polymer.

In the ninth aspect of this invention, the polyimide of the eighth aspect of this invention is produced by subjecting the polyamide acid of the polyimide of the sixth aspect of the invention to ring closure by application of heat. Though the heat treatment of the polyamide acid may be carried out in a solvent or in the absence of a solvent. In the light of the efficiency of the reaction, the heat treatment is preferably performed in a solvent. In this case, the polyamide acid may be in the form of the solution which is obtained in the aforementioned process for the production of a polyamide acid by the reaction of a 1,3-diaminobenzene derivative with a halogenated tetracarboxylic acid derivative or in the form of what is obtained by separating the polyamide acid in a solid form from the solution and redissolving the solid polyamide acid in a solvent. As concrete examples of the other solvent to be used in the latter method, polar solvents such as N-methyl-2-pyrrolidinone, N,N-dimethyl acetamide, acetonitrile, benzonitrile, nitrobenzene, nitromethane, dimethyl sulfoxide, acetone, methylethyl ketone, isobutyl ketone, and methanol and non-polar solvents such as toluene and xylene may be cited. Among these solvents enumerated above, N-methyl-2-pyrrolidinone and N,N-dimethyl acetamide are preferably used. These solvents may be used either singly or in the form of a mixture of two or more members.

The conditions for the heat treatment in the ninth aspect of this invention do not need to be particularly restricted but are only required to effect the ring closure of the polyamide acid of the polyimide of the sixth aspect of the invention efficiently and produce the polyimide aimed at. Specifically, the heat treatment is performed generally in the air and preferably in the atmosphere of an inert gas such as nitrogen, helium, or argon at a temperature in the approximate range of 70–350° C. for a period in the approximate range of 2–5 hours. The heat treatment of the polyimide of the eighth aspect of the invention may be carried out stepwise or continuously. In a preferred embodiment, the heat treatment of the polyamide acid is carried out stepwise, namely at 70° C. for two hours, at 160° C. for one hour, at 250° C. fo 30 minutes, and at 350° C. for one hour.

Since the polyimide of the polyimide of the eighth aspect of the invention has no carbon-hydrogen bond (C—H bond) in the molecular chain thereof, it does not show in the absorption spectrum thereof in the near infrared range a peak originating in the higher harmonic wave of a C—H bond stretching vibration, or originating in the combination vibration of the higher harmonic wave of a C—H bond stretching vibration and deformation vibration. It, therefore, can accomplish a low light loss throughout the whole light communication wavelength (1.0–1.7 $\mu$m). Thus, the polyimide of the eighth aspect of the invention can satisfy high light transmittance and heat resistance simultaneously throughout the whole transmission wavelength and also excels in chemical resistance, water repellency, dielectric characteristics, electrical characteristics, and optical characteristics. It is, therefore, useful for various optical materials such as printed wiring boards, LSI grade layer insulating films, sealing materials for semiconductor parts, optical parts, optoelectronic integrated circuits (OEIC), and optical wave guides for optoelectronic mixed packaging wiring boards.

The tenth aspect of this invention provides an optical material containing the polyimide of the eighth aspect of this invention.

The optical material in the tenth aspect of this invention essentially contains the polyimide of the eighth aspect of this invention. It may additionally contain other components with the object of further exalting the necessary characteristics such as the light transmittance, heat resistance, chemical resistance, water repellency, dielectric characteristics, electrical characteristics, and optical characteristics. As concrete examples of the other components which are used in this case, polyamide, polyamideimide, epoxy resin, phenol resin, melamine resin, urea resin, diallyl phthalate resin, unsaturated polyester resins, urethane resin, addition type unsaturated polyimide resin, silicone resin, polyparavinyl phenol resin, polyphenylene sulfide, polyether, polyetherether ketone, polypropylene, and polyazo-methine; fluorocarbon resins such as polytetrafluoroethylene (PTFE), tetrafluoroethylene hexafluoropropylene copolymer (FEP), ethylene-tetrafluoroethylene copolymer (ETFE), tetrafluoroethylene-perfluoroalkylvinyl ether copolymers (PFA), and polychlorotrifluoroethylene (PCTFE); inorganic fillers such as powders and short fibers of calcium carbonate, silica, alumina, titania, aluminum hydroxide, aluminum silicate, zirconium silicate, zircon, glass, talc, mica, graphite, aluminum, copper, and iron; mold release agents such as fatty acids and waxes; coupling agents such as epoxy silane, vinyl silane, borane type compounds and alkyl titanate type compounds; flame retardants such as antimony or phosphorus compounds and halogen-containing compounds; and various additives such as dispersants and solvents may be cited.

The method for applying the optical material of the tenth aspect of this invention is identical with the conventional method except the use of the polyimide of the eighth aspect of this invention. When the optical material of the tenth aspect of this invention is used for a printed wiring board, for example, a polyimide film can be formed on a substrate by coating the substrate with a polyamide acid solution by a known method such as, for example, casting, spin coating, roll coating, spray coating, bar coating, flexographic printing, or dip coating and then heating the applied coat on the substrate in the atmosphere of an inert gas such as nitrogen, helium, or argon at a temperature in the range of 70–350° C. for a period in the range of 2–5 hours. In the method described above, the polyamide acid solution may be in the form of the solution which is obtained in the aforementioned method of the seventh aspect of this invention by the reaction of a 1,3-diaminobenzene derivative with a halogenated tetracarboxylic acid derivative or in the form of what is obtained by separating the polyamide acid in a solid form from the solution and redissolving the solid polyamide acid in a solvent. As concrete examples of the these solvent to be used in the latter case, polar solvents such as N-methyl-2-pyrrolidinone, N,N-dimethyl acetamide, acetonitrile, benzonitrile, nitrobenzene, nitromethane, dimethyl sulfoxide, acetone, methylethyl ketone, isobutyl ketone and methanol; and non-polar solvents such as toluene and xylene may be cited. Among these solvents enumerated above, N-methyl-2-pyrrolidinone and N,N-dimethyl acetamide are preferably used. These solvents may be used either singly or in the form of a mixture of two or more members. Incidentally, in the method described above, the thickness of the film, for example, may be properly selected to suit the purpose for which the film is used. The known size may be similarly used.

EXAMPLE

Now, this invention will be described more specifically below with reference to examples thereof.

Example 1

A three-necked flask having an inner volume of 50 ml was charged with 1.88 g (10 mmols) of 1,3-diamino-2,4,5,6-tetrafluorobenzene, 1.21 g (2 mmols) of 4,4'-[(2,3,5,6-tetrafluoro-1,4-phenylene)-bis(oxy)]-bis(3,5,6-trifluorophthalic anhydride) represented by the following formula:

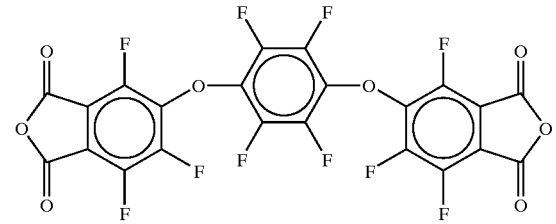

5.41 g (8 mmols) of 4,4'-[(2,3,5,6-tetrachloro-1,4-phenylene)-bis(oxy)]-bis(3,5,6-trifluorophthalic anhydride) represented by the following formula;

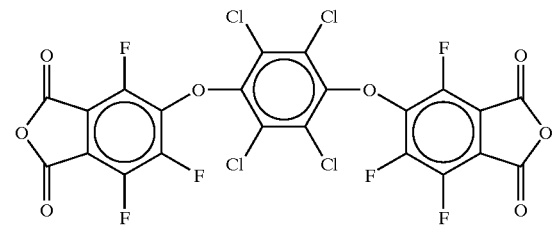

and 11.5 g of N,N-dimethyl acetamide. A polyamide acid solution was obtained by stirring the resultant mixed solution in the atmosphere of nitrogen at room temperature for two days.

When the polyamide acid thus obtained was analyzed with an IR spectrum, the result shown in FIG. 1 was obtained.

Referential Example 1

A referential polyamide acid solution was obtained by following the procedure of Example 1 while using 6.05 g (10 mmols) of 4,4'-[(2,3,5,6-tetrafluoro-1,4-phenylene)-bisoxy)]-bis(3,5,6-trifluorophthalic anhydride) alone as an acid anhydride.

Example 2

A polyimide film and a referential polyimide film were severally formed on silicon substrates of 4 inches in diameter by spin-coating the polyamide acid solution and the referential polyamide acid solution obtained respectively in Example 1 and Referential Example 1 each in a thickness of 8 μm on the silicon substrates and heating the deposited layers of the solutions in the atmosphere of nitrogen at 70° C. for two hours, at 160° C. for one hour, at 250° C. for 30 minutes, and at 350° C. for one hour.

Figure 2:
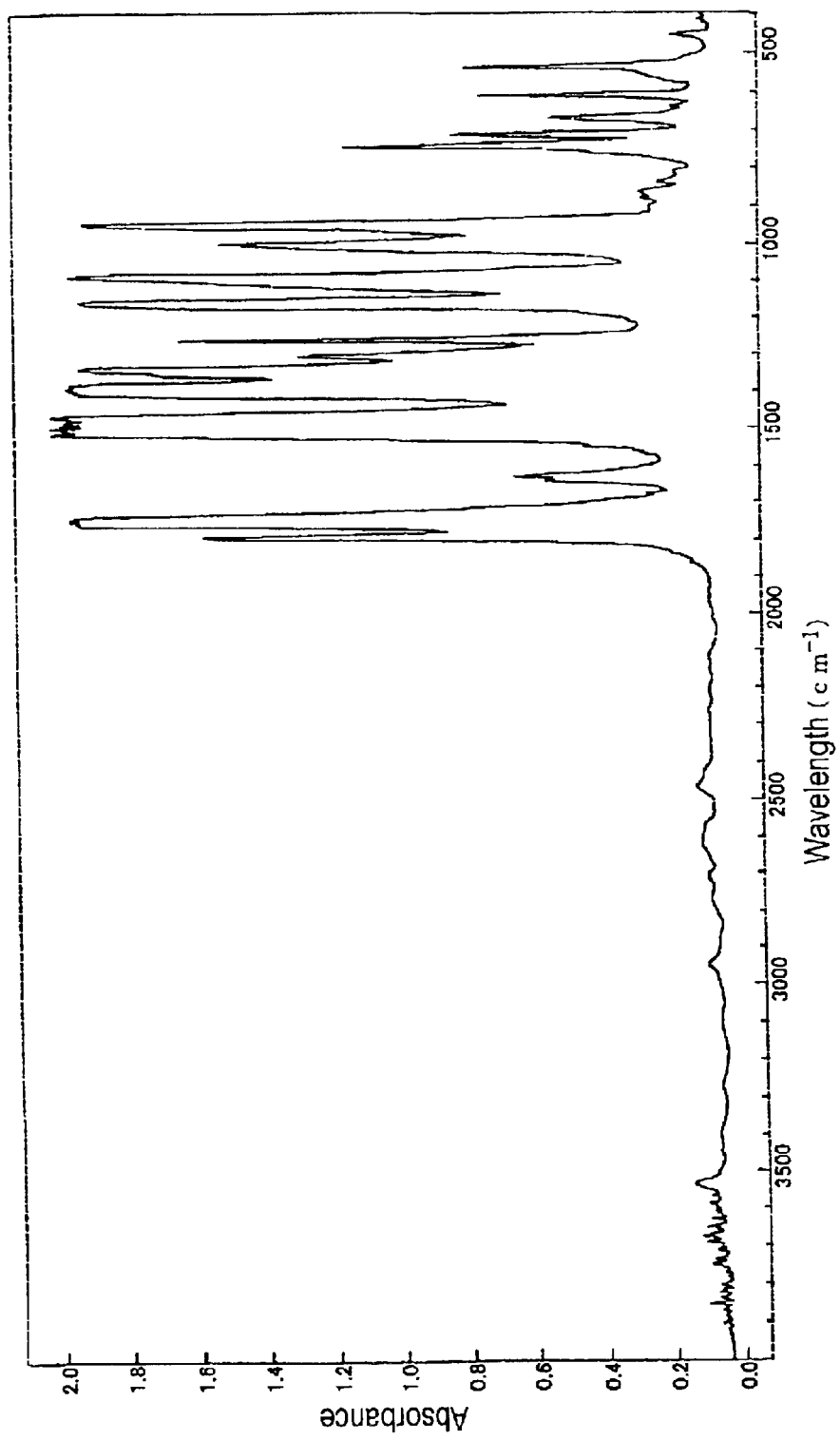
FIG. 2 is an IR spectrum of a polyimide obtained in Example 2.

When the polyimide films thus obtained were analyzed with IR spectra, the results shown in FIG. 2 were obtained.

Then, when the polyimide films thus obtained were tested for absorption of light communication wavelength (0.8–1.7 μm), it was ascertained that the light transmission loss in that wavelength was extremely small.

Further, when the polyimide film and the referential polyimide film thus obtained were tested for refractive index at 633 and 1300 nm, the results shown in Table 1 given below were obtained.

TABLE 1

| | Wavelength | | | |
| --- | --- | --- | --- | --- |
| | 633 nm | | 1300 nm | |
| | TE | TM | TE | TM |
| Referential polyimide film | 1.546 | 1.538 | 1.522 | 1.515 |
| Polyimide film | 1.569 | 1.562 | 1.544 | 1.538 |
| Refractive index difference (%) | 1.49 | 1.56 | 1.45 | 1.51 |

From the data shown in Table 1, it is inferred that since the polyimide film of this invention had a refractive index difference exceeding 1.0%, it could tolerate fully satisfactorily the impacts of the actual use for various optical materials typified by optical waveguides.

Example 3

A three-necked flask having an inner volume of 50 ml was charged with 1.072 g (5.5 mmols) of 5-chloro-1,3-diamino-2,4,6-trifluorobenzene, 3.177 g (5.5 mmols) of 4,4'-[(2,3,5,6-tetrafluoro-1,4-phenylene)-bis(oxy)]-bis(3,5,6-trifluorophthalic anhydride) represented by the following formula:

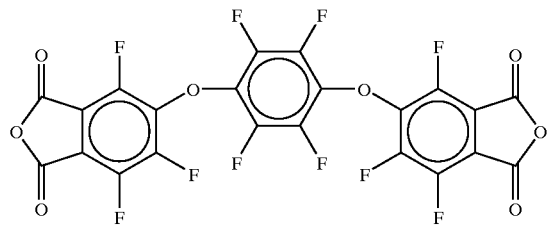

and 5.7 g of N,N-dimethyl acetamide. A polyamide acid solution was obtained by stirring the resultant mixed solution in the atmosphere of nitrogen at room temperature for two days.

Figure 3:
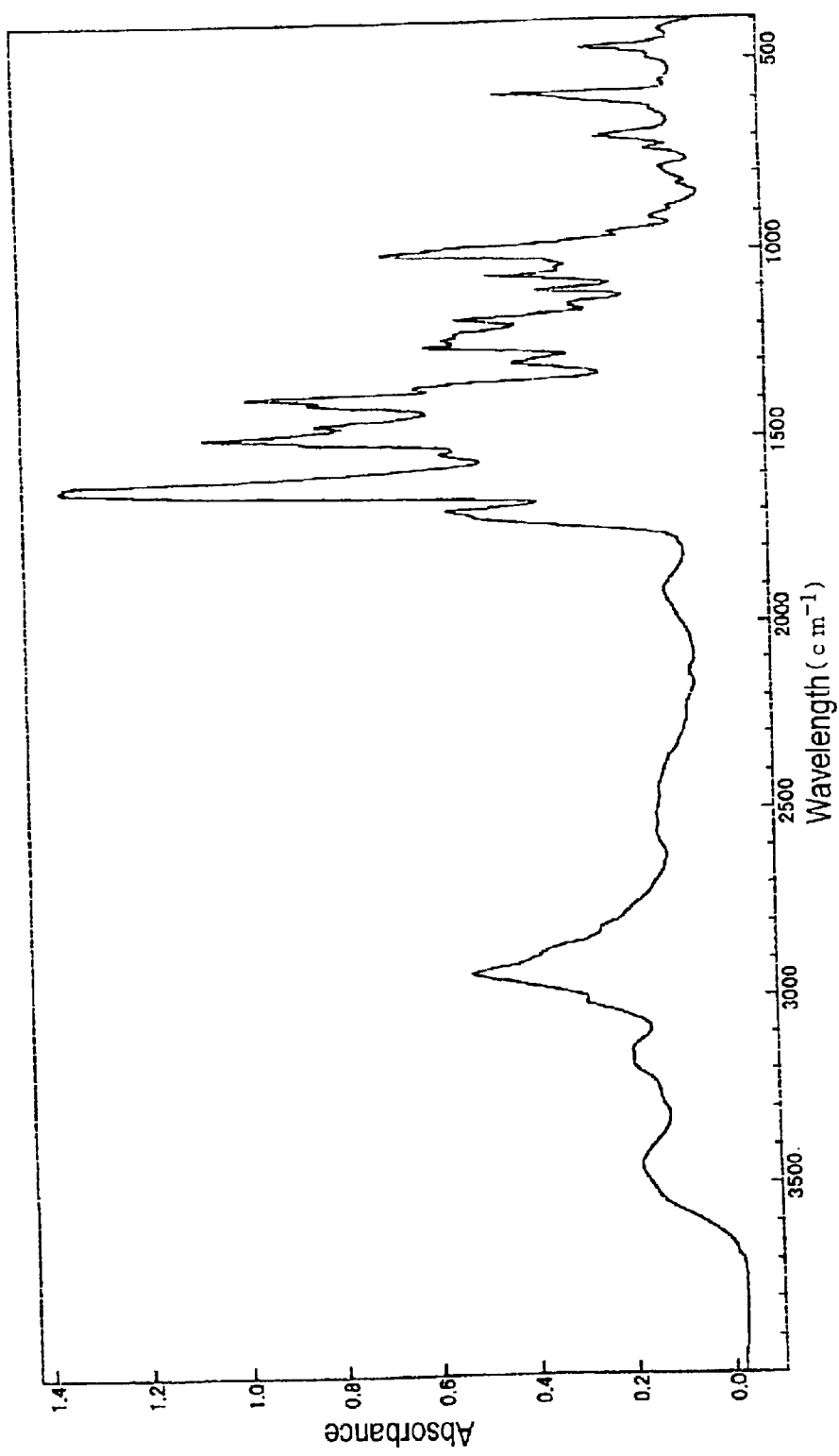
FIG. 3 is an IR spectrum of a polyamide acid obtained in Example 3.

When the polyamide acid thus obtained was analyzed with an IR spectrum, the result shown in FIG. 3 was obtained.

Referential Example 2

A referential polyamide acid solution was obtained by following the procedure of Example 3 while using 0.99 g (5.5 mmols) of 1,3-diamino-2,4,5,6-tetrafluorobenzene in the place of 5-chloro-1,3-diamino-2,4,6-trifluorobenzene.

Example 4

A polyimide film and a referential polyimide film were severally formed on silicon substrates of 4 inches in diameter by spin-coating the polyamide acid solution and the referential polyamide acid solution obtained respectively in Example 3 and Referential Example 2 each in a thickness of 8 μm on the silicon substrates and heating the deposited layers of the solutions in the atmosphere of nitrogen at 70° C. for two hours, at 160° C. for one hour, at 250° C. for 30 minutes, and at 350° C. for one hour.

Figure 4:
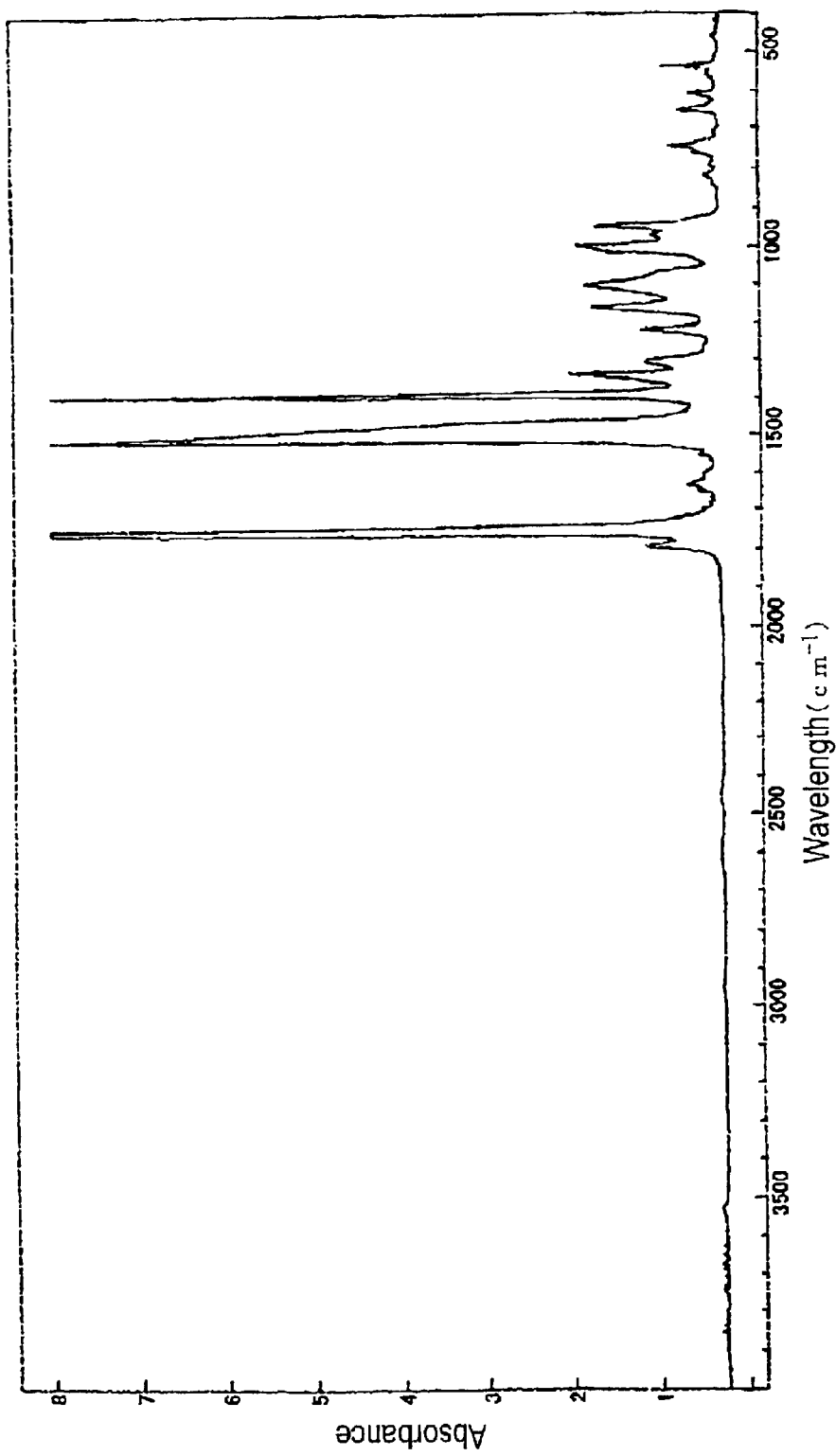
FIG. 4 is an IR spectrum of a polyimide obtained in Example 4.

When the polyimide films thus obtained were analyzed with respective IR spectra, the results shown in FIG. 4 were obtained.

Then, when the polyimide films thus obtained were tested for absorption of light communication wavelength (0.8–1.7 μm), it was ascertained that the light transmission loss in the wavelength was extremely small.

Further, when the polyimide film and the referential polyimide film thus obtained were tested for refractive index at 633 and 1300 nm, the results shown in Table 2 given below were obtained.

TABLE 2

| | Wavelength | | | |
| --- | --- | --- | --- | --- |
| | 633 nm | | 1300 nm | |
| | TE | TM | TE | TM |
| Referential polyimide film | 1.546 | 1.538 | 1.522 | 1.515 |
| Polyimide film | 1.556 | 1.549 | 1.532 | 1.526 |
| Refractive index difference (%) | 0.65 | 0.72 | 0.66 | 0.73 |

From the data shown in Table 2, it is inferred that since the polyimide film of this invention had a refractive index difference exceeding 0.5%, it could tolerate fully satisfactorily the impacts of the actual use for various optical materials typified by optical waveguides.

The entire disclosure of Japanese Patent Application Nos. 2001-213743 and 2001-213744 filed on Jul. 13, 2001, respectively, including specifications, claims, drawings and summary are incorporated herein by reference in its entirety.

What is claimed is:

1. A polyamide acid containing a chlorine atom and a fluorine atom and comprising a repeating unit represented by the following formula (1):

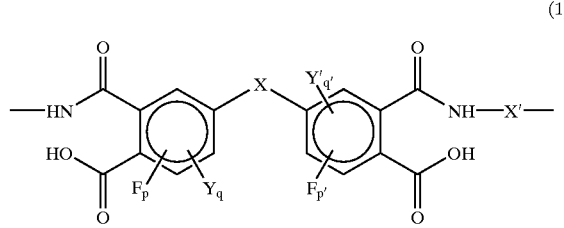

(1)

(wherein X and X' independently denote a divalent organic group; Y and Y' independently denote a chlorine, bromine, or iodine atom; p and p' denote independently denote the number of fluorine atom {F in the formula (1)} bonded to the relevant benzene ring, representing an integer of 0–3; q and q' independently denote an integer of 0–3; and p+q total 3, and p'+q' total 3).

2. A polyimide containing a chlorine atom and a fluorine atom and comprising a repeating unit represented by the following formula (2):

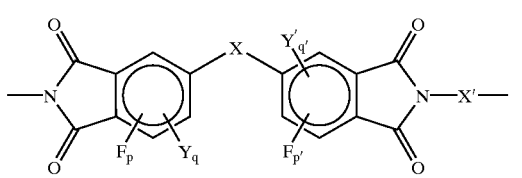

(2)

(wherein X and X' independently denote a divalent organic group; Y and Y' independently denote a chlorine, bromine, or iodine atom; p and p' independently denote the number of fluorine atom {F in the formula (2)} bonded to the relevant benzene ring, representing an integer of 0–3; q and q' independently denote an integer of 0–3; and p+q total 3, and p'+q' total 3).

3. A method for the production of a polyamide acid of claim 1, which comprises causing a diamine compound represented by the following formula (5) to react with a tetracarboxylic acid represented by the following formula (7), an acid anhydride or an acid chloride thereof, or an esterification product thereof in an organic solvent:

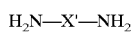

(5)

(wherein X' denotes a divalent organic group)

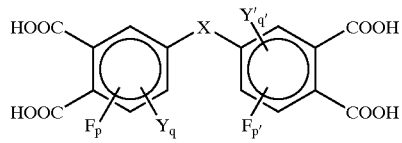

(7)

(wherein X denotes a divalent organic group; Y and Y' independently denote a chlorine, bromine, or iodine atom; p and p' independently denote the number of fluorine atom {F in the formula (7)} bonded to the relevant benzene ring, representing an integer of 0–3; q and q' independently denote an integer of 0–3; and p+q total 3, and p'+q' total 3).

4. A method for production of the polyimide of claim 2, which comprises subjecting the polyamide acid of claim 1 to ring closure by application of heat.

5. An optical material containing the polyimide of claim 2.

6. A polyamide acid comprising a repeating unit represented by the following formula (i):

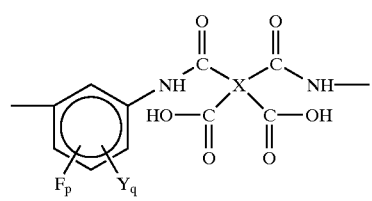

(i)

(wherein X denotes a tetravalent group; Y denotes a chlorine, bromine, or iodine atom; p denotes the number of fluorine atom {F in the formula (i)} bonded to the relevant benzene ring, representing an integer of 0–3; q denotes an integer of 1–4, and p+q total 4).

7. A polyamide acid according to claim 6, which further comprises a repeating unit represented by the following formula (ii):

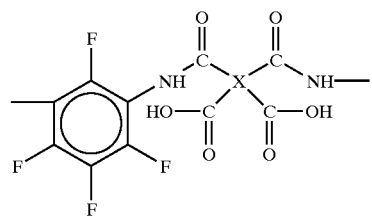

(ii)

(wherein X denotes a tetravalent organic group).

8. A polyimide comprising a repeating unit represented by the following formula (iii):

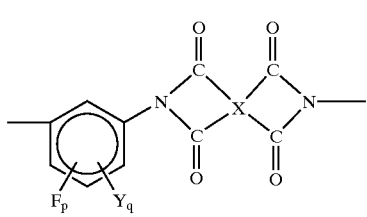

(iii)

(wherein X denotes a tetravalent organic group; Y denotes a chlorine, bromine, or iodine atom; p denotes the number of fluorine atom {F in the formula (iii)} bonded to the relevant benzene ring, representing an integer of 0–3; q denotes an integer of 1–4, and p+q total 4).

9. A polyimide according to claim 8, which further comprises a repeating unit represented by the following formula (iv):

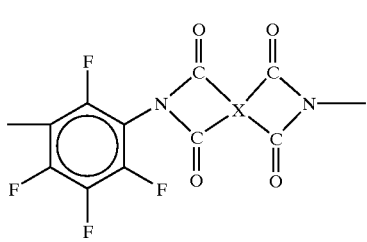

(iv)

(wherein X denotes a tetravalent organic group).

10. A method for the production of the polyamide acid of claim 6, which comprises causing a 1,3-diaminobenzene derivative represented by the following formula (vii) to react with a halogenated tetracarboxylic acid represented by the following formula (viii), an acid anhydride or an acid chloride thereof, or an esterification products thereof in an organic solvent:

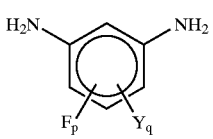

(vii)

(wherein Y denotes a chlorine, bromine, or iodine atom; p denotes the number of fluorine atom {F in the formula (vii)} bonded to the relevant benzene ring, representing an integer of 0–3, q denotes an integer of 1–4, and p+q total 4)

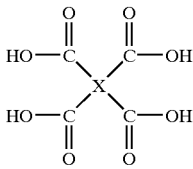

(viii)

(wherein X denotes a tetravalent organic group).

11. A method for the production of the polyimide of claim 8, which comprises subjecting the polyamide acid of claim 6 to ring closure by application of heat.

12. A method of claim 11, wherein the polyamide acid further comprises a repeating unit represented by formula (ii) and the polyimide further comprises a repeating unit represented by formula (iv), X in both formulas (ii) and (iv) denoting a tetravalent organic group.

13. An optical material containing a polyimide of claim 8.

14. An optical material containing a polyimide of claim 9.

* * * * *